(12) United States Patent
Gosling et al.

(10) Patent No.: US 10,400,448 B2
(45) Date of Patent: Sep. 3, 2019

(54) RECONFIGURABLE WALL PANELS

(71) Applicant: DIRTT ENVIRONMENTAL SOLUTIONS, INC., Salt Lake City, UT (US)

(72) Inventors: Geoff Gosling, Calgary (CA); Mogens Smed, DeWinton (CA); Mark Tisdall, Calgary (CA); Brian Cassie, Calgary (CA); Kenton Hovdebo, Lomond (CA)

(73) Assignee: DIRTT Environmental Solutions, Ltd., Calgary (CA)

( * ) Notice: Subject to any disclaimer, the term of this patent is extended or adjusted under 35 U.S.C. 154(b) by 0 days.

(21) Appl. No.: 15/038,694

(22) PCT Filed: Mar. 16, 2016

(86) PCT No.: PCT/US2016/022634
§ 371 (c)(1),
(2) Date: May 23, 2016

(87) PCT Pub. No.: WO2016/149362
PCT Pub. Date: Sep. 22, 2016

(65) Prior Publication Data
US 2018/0002924 A1  Jan. 4, 2018

Related U.S. Application Data

(60) Provisional application No. 62/175,072, filed on Jun. 12, 2015, provisional application No. 62/133,569, filed on Mar. 16, 2015.

(51) Int. Cl.
*H01H 9/00* (2006.01)
*E04B 2/74* (2006.01)
(Continued)

(52) U.S. Cl.
CPC .............. *E04B 2/7401* (2013.01); *B32B 7/12* (2013.01); *B32B 17/061* (2013.01);
(Continued)

(58) Field of Classification Search
CPC ........ B32B 7/12; B32B 17/061; E04F 13/145; E04B 2/7401
(Continued)

(56) References Cited

U.S. PATENT DOCUMENTS 3,498,405 A  3/1970  Charpentier
3,646,180 A  2/1972  Winnick
(Continued)

FOREIGN PATENT DOCUMENTS

CN    201197135    2/2009
DE    3900397      7/1990
(Continued)

OTHER PUBLICATIONS

International Search Report and Written Opinion for application No. PCT/US2016/022634 dated Jul. 6, 2016.
(Continued)

*Primary Examiner* — Gisele D Ford
(74) *Attorney, Agent, or Firm* — Workman Nydegger

(57) ABSTRACT

Reinforced panels include a layer of glass joined to a substrate to support the glass. Connectors are joined to the side of the substrate opposite the glass to enable the reinforced panel to be configured with and/or attached to a modular wall system. The glass can be backpainted prior to joining to the substrate, and/or a film can be included in the reinforced tile disposed between the glass panel and the substrate. A reinforced panel includes a conductive material disposed between a glass layer and a substrate to form a touch-responsive section. One or more intermediate layers disposed between the glass layer and the substrate are
(Continued)

included. The one or more intermediate layers have sufficient elastic deformability so as to enable the reinforced panel to tolerate differences in thermal expansion between the substrate and the glass layer without resulting in cracking of the glass layer.

32 Claims, 11 Drawing Sheets

(51) Int. Cl.
  *E04C 2/26* (2006.01)
  *E04C 2/38* (2006.01)
  *B32B 17/06* (2006.01)
  *B44C 5/04* (2006.01)
  *G06F 3/044* (2006.01)
  *C03B 33/07* (2006.01)
  *B32B 7/12* (2006.01)
  *H03K 17/96* (2006.01)

(52) U.S. Cl.
  CPC .......... *B44C 5/0407* (2013.01); *B44C 5/0415* (2013.01); *B44C 5/0461* (2013.01); *C03B 33/074* (2013.01); *E04C 2/26* (2013.01); *E04C 2/38* (2013.01); *G06F 3/044* (2013.01); *B32B 2309/105* (2013.01); *B32B 2607/00* (2013.01); *E04B 2/745* (2013.01); *E04B 2103/00* (2013.01); *G06F 2203/04103* (2013.01); *H03K 2017/9602* (2013.01)

(58) Field of Classification Search
  USPC ................ 200/341; 52/510, 506.01, 173.3, 1
  See application file for complete search history.

(56) References Cited

U.S. PATENT DOCUMENTS

| | | | |
|---|---|---|---|
| 3,852,148 A * | 12/1974 | Pryor | A47J 36/02 |
| | | | 428/433 |
| 3,869,198 A * | 3/1975 | Ballentine | C03C 17/00 |
| | | | 359/592 |
| 4,177,101 A | 12/1979 | Evans | |
| 4,337,997 A * | 7/1982 | Sadoune | B32B 15/04 |
| | | | 359/848 |
| 4,556,598 A * | 12/1985 | Bloom | H01L 21/4803 |
| | | | 156/89.28 |
| 4,663,228 A * | 5/1987 | Bolton | B32B 15/04 |
| | | | 156/106 |
| 4,689,262 A * | 8/1987 | Bloom | C03C 14/002 |
| | | | 174/256 |
| 5,132,681 A * | 7/1992 | Yabe | G06F 1/16 |
| | | | 340/3.1 |
| 5,301,484 A | 4/1994 | Jansson | |
| 5,598,674 A * | 2/1997 | Lay | B32B 15/08 |
| | | | 52/309.1 |
| 5,640,297 A * | 6/1997 | Labaze | B64D 11/0015 |
| | | | 160/127 |
| 5,820,991 A * | 10/1998 | Cabo | B32B 15/04 |
| | | | 428/432 |
| 5,822,935 A | 10/1998 | Mitchell | |
| 5,860,255 A | 1/1999 | Fishel | |
| 6,000,180 A | 12/1999 | Goodman | |
| 6,029,418 A * | 2/2000 | Wright | B32B 7/12 |
| | | | 403/210 |
| 6,131,347 A | 10/2000 | Hornberger | |
| 6,446,396 B1 | 9/2002 | Marangoni | |
| 6,446,404 B1 * | 9/2002 | Bassin | A47B 96/18 |
| | | | 428/45 |
| 7,268,311 B2 | 9/2007 | Tanabe | G06F 3/045 |
| | | | 200/314 |
| 7,645,954 B2 * | 1/2010 | Yasuda | H01H 13/704 |
| | | | 200/314 |
| 8,646,739 B2 | 2/2014 | Moyer | |
| 8,729,446 B2 * | 5/2014 | Verfuerth | H05B 37/0272 |
| | | | 250/205 |
| 9,673,851 B2 | 6/2017 | Pelster | |
| 9,747,823 B2 | 8/2017 | Lorenzini | |
| 2003/0193709 A1 | 10/2003 | Mallya et al. | |
| 2004/0045225 A1 | 3/2004 | Weiss | |
| 2005/0204596 A1 | 9/2005 | Peng | |
| 2006/0050063 A1 * | 3/2006 | Tanabe | G02F 1/13338 |
| | | | 345/173 |
| 2006/0052097 A1 | 3/2006 | Struthers | |
| 2006/0080939 A1 * | 4/2006 | Bledsoe | E04F 13/16 |
| | | | 52/750 |
| 2006/0097989 A1 * | 5/2006 | Ho | G06F 3/0421 |
| | | | 345/173 |
| 2006/0210755 A1 | 9/2006 | Blazek | |
| 2007/0070192 A1 | 3/2007 | Shalam | |
| 2009/0160796 A1 | 6/2009 | Jiang | |
| 2009/0174998 A1 | 7/2009 | Struthers | |
| 2009/0256040 A1 | 10/2009 | Lee | |
| 2009/0324962 A1 * | 12/2009 | Manetti | B32B 3/04 |
| | | | 428/424.2 |
| 2010/0002298 A1 * | 1/2010 | Sugino | B32B 7/12 |
| | | | 359/485.01 |
| 2010/0138581 A1 | 6/2010 | Bird | |
| 2010/0236173 A1 * | 9/2010 | Pacha | B32B 5/18 |
| | | | 52/309.11 |
| 2012/0033375 A1 | 2/2012 | Madonna | |
| 2012/0102844 A1 * | 5/2012 | Damo | F24J 2/0444 |
| | | | 52/1 |
| 2012/0141735 A1 | 6/2012 | Chevallier | |
| 2012/0293855 A1 | 11/2012 | Shrivastava et al. | |
| 2013/0094168 A1 | 4/2013 | Jaeger | |
| 2014/0133137 A1 | 5/2014 | Kiss | |
| 2014/0157693 A1 * | 6/2014 | Schumacher | H01L 31/048 |
| | | | 52/173.3 |
| 2014/0338272 A1 * | 11/2014 | Shiao | H02S 20/23 |
| | | | 52/173.3 |
| 2014/0362050 A1 * | 12/2014 | Wilson | G06F 3/042 |
| | | | 345/175 |
| 2015/0029412 A1 * | 1/2015 | Kishioka | G06F 3/044 |
| | | | 349/12 |
| 2015/0085439 A1 | 3/2015 | Lee | |
| 2015/0118869 A1 | 4/2015 | Brown et al. | |
| 2015/0343884 A1 * | 12/2015 | Rousselet | B32B 17/10192 |
| | | | 359/360 |
| 2016/0007487 A1 | 1/2016 | Lee | |
| 2016/0052241 A1 * | 2/2016 | Zhang | B32B 17/101 |
| | | | 428/215 |
| 2016/0071664 A1 * | 3/2016 | Cohen | H01H 13/52 |
| | | | 200/341 |
| 2016/0211878 A1 | 7/2016 | Pelster | |
| 2016/0327300 A1 | 11/2016 | Ribbich | |
| 2016/0363143 A1 | 12/2016 | Druce | |
| 2017/0256927 A1 | 9/2017 | Padilla | |

FOREIGN PATENT DOCUMENTS

| | | |
|---|---|---|
| DE | 9307530 U1 | 9/1994 |
| DE | 29620551 U1 | 3/1997 |
| DE | 102012008969 A1 | 11/2013 |
| EP | 0000913 | 3/1979 |
| EP | 378133 | 7/1990 |
| GB | 2323780 | 7/1998 |
| KR | 1020120040541 | 4/2012 |
| WO | 9626336 | 8/1996 |
| WO | 9816870 | 4/1998 |
| WO | 2004114105 | 12/2004 |
| WO | 2006123335 | 11/2006 |
| WO | 2009109538 | 9/2009 |
| WO | 2011096580 | 8/2011 |
| WO | 2014132715 | 9/2014 |
| WO | 2015017198 | 2/2015 |

(56) References Cited

FOREIGN PATENT DOCUMENTS

WO        20170213960        12/2017
WO         2018009936         1/2018

OTHER PUBLICATIONS

International Search Report on Patentability Chapter I for application No. PCT/US2016/022634 dated Sep. 19, 2017.
International Search Report and Written Opinion for application No. PCT/US2017/041387 dated Oct. 19, 2017.
International Search Report and Written Opinion for application No. PCT/US2017/035520 dated Aug. 18, 2017.
Second Search Report and Written Opinion for application No. 11201606345U dated Feb. 13, 2018.
Non-Final Office Action for U.S. Appl. No. 15/741,180 dated Oct. 5, 2018.
European Search Report and Written Opinion for application No. PCT/US2016022634 dated Oct. 23, 2018.
Office Action for U.S. Appl. No. 15/741,180, dated May 9, 2019.
Final Office Action for U.S. Appl. No. 15/741,180, dated Feb. 21, 2019.

* cited by examiner

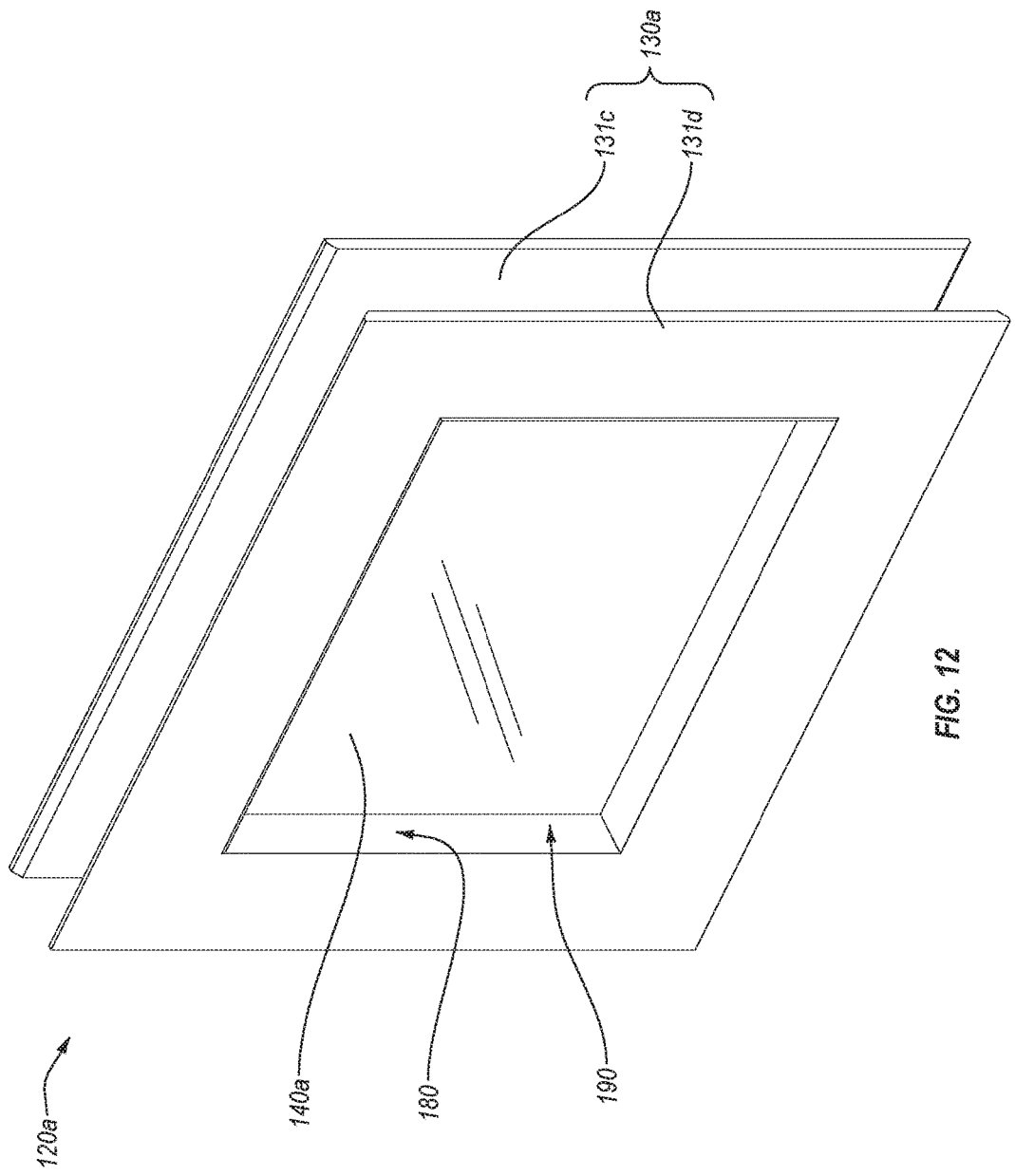

RECONFIGURABLE WALL PANELS

CROSS-REFERENCE TO RELATED APPLICATIONS

The present invention is a 35 U.S.C. § 371 U.S. National Stage of PCT Application No. PCT/US16/22634, filed on Mar. 16, 2016, the entire content of which is incorporated herein by reference.

BACKGROUND

Technical Field

This disclosure relates generally to modular wall systems. More specifically, the present disclosure relates to devices, systems, and methods for configuring and/or attaching glass or resin panels, windows, or other structures into modular walls.

Background and Relevant Art

Panels and other structures made of shatterable materials such as glass can provide an aesthetically pleasing look or provide useful functionality when applied as a surface or panel to a wall. However, there can also be a number of drawbacks to its use. Glass, ceramics, some resins, and other shatterable materials are fragile and subject to breakage. Further, because of the properties of glass, building codes are often more stringent when such materials are applied as finish materials. In addition, connecting such shatterable materials to a modular wall or integrating such panels into a reconfigurable wall can present further challenges. In such applications, which typically require repeated connection, removal, and reconnection of the panel, the use of shatterable materials can be challenging. Typically, fastening the necessary connection components onto the glass requires spot gluing onto the glass, which detrimentally affects the look of any backpainting of the glass as seen from the front side, particularly at the point of connection.

Further, preparing and positioning sections of such shatterable materials to be incorporated into a modular wall can involve the manipulation of large, rigid, and fragile sections of the shatterable materials, thereby increasing the likelihood of material breakage or other damage, as well as increasing panel production time, manufacturing space, and storage space requirements.

In addition, where panels or surfaces are intended to be used as touch-responsive switches, the high cost of specialized glass coatings or treatments can be prohibitive, and such coatings or treatments can often alter the properties and appearance of the panel. Further, the functionality of such touch-responsive panels can be limited by size limitations in the area of the panel responsive to touch.

Accordingly, there is a need for improved reconfigurable wall systems having panels formed from glass and/or other shatterable materials that limit or avoid these disadvantages.

BRIEF SUMMARY

Implementations of the present disclosure solve one or more of the foregoing or other problems in the art with systems, methods, and devices for enhancing windows, panels, passthroughs, or other such objects made from glass or other shatterable materials (e.g., ceramics, resins, etc.) by combining a layer of shatterable material with a substrate.

Certain embodiments can include a sheet, layer, cutout, or other similar structure of glass affixed to a substrate material to form a reinforced glass panel which is then affixed to a portion of a reconfigurable wall. The combination of the glass and substrate forming the reinforced glass panel becomes much stronger than a glass panel by itself, and can be very hard to damage. A layer of glass can be applied as-is (e.g., allowing the substrate to show through where the glass layer is transparent or semi-transparent), applied after backpainting the glass, applied after applying an aesthetic and/or functional film to the back of the glass, and/or applied after etching or other processing or alteration of the glass (e.g., digital printing on the glass).

In certain embodiments, the glass layer and substrate are joined by adhesion, such as by spreading an adhesive on the surface (or portion of the surface) of the glass layer and/or substrate and joining the glass layer and substrate. Additionally, or alternatively, a sheet adhesive can be applied equally across the entire surface of the glass layer and/or substrate or across a portion of the surface(s). Such a film applied between the glass and substrate may be self-adhesive or may utilize applied adhesives in addition to the film. In some embodiments, the adhesive is polyurethane glue. Other embodiments may utilize one or more additional or alternative adhesives.

In certain embodiments, connectors, connection systems, clips, clamps, ties, joints, and/or other fasteners can then be attached to the substrate side of the reinforced glass panel (e.g., to the side of the substrate opposite the side joined to the glass layer) rather than directly to the glass layer. Such connectors can then be used in conjunction with correlating or matching connectors of a modular wall system or other reconfigurable wall surface for attachment of the reinforced glass panel to the wall or integration of the reinforced glass panel into the wall.

Certain embodiments include substrates that are more flexible than the glass layer and thereby provide advantages of resisting shattering and other damage (e.g., damaged or broken shards remain affixed to the flexible substrate rather than spreading or falling). Other substrates may not be more flexible, or may be less flexible than the glass layer. For example, some substrates may be used to provide better connection of fasteners or other hardware to the reinforced glass panel and/or may provide improved strength or aesthetics. Other substrates may be more rigid and more resistant to torsional, compressive, tensile, and/or other forces than the glass layer, thereby preventing the glass layer from bending, twisting, stretching, and/or compressing to a breaking point after attachment to the substrate.

Certain embodiments include one or more intermediate layers, disposed between the glass layer and the substrate, configured to compensate for differences in material properties between the glass layer and the substrate. For example, some embodiments include a substrate layer having a different coefficient of thermal expansion relative to the glass layer. In such embodiments, changes in temperature and/or humidity can lead the substrate and the glass layer to change size (e.g., expand or contract) at different rates and/or with different magnitudes, subjecting the separate components to tensile and/or compressive forces. In the absence of one or more intermediate layers configured to absorb the impact of the resulting tensile or compressive forces, one or more of the panel components (e.g., the glass layer) will often crack. Certain embodiments of intermediate layers are configured to provide a buffer for absorbing or deflecting compressive and tensile forces arising between the substrate and the glass layer due to differences in material properties between the separate panel components.

BRIEF DESCRIPTION OF THE DRAWINGS

In order to describe the manner in which the above-recited and other advantages and features of the disclosure can be obtained, a more particular description of the disclosure briefly described above will be rendered by reference to specific embodiments thereof which are illustrated in the appended drawings. Understanding that these drawings depict only typical embodiments of the disclosure and are not therefore to be considered to be limiting of its scope, the disclosure will be described and explained with additional specificity and detail through the use of the accompanying drawings in which:

FIGS. 9-14 illustrate various modular wall systems and associated connectors suitable for use with the reinforced panels of the present disclosure.

DETAILED DESCRIPTION

Reinforced Tiles

Figure 1:
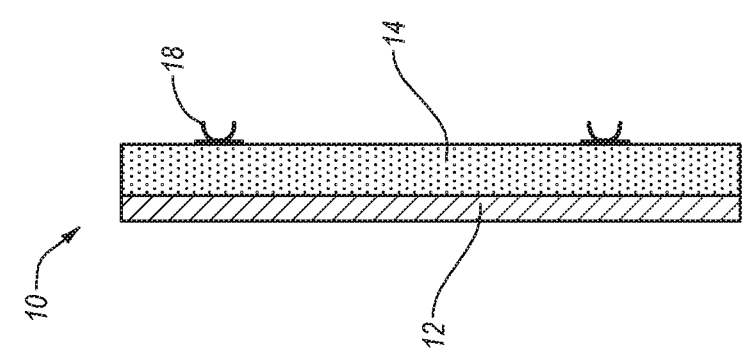
FIG. 1 illustrates a reinforced panel including a glass panel and a substrate with connectors.

Embodiments of the present disclosure include panels, tiles, surfaces, and other such structures formed from glass and/or other shatterable materials (e.g., ceramics, plasters, resins, etc.) attached to and/or reinforced by a substrate to form a reinforced panel. In some embodiments, such reinforced panels can include one or more connectors (e.g. clips, clamps, ties, protrusions, or other fasteners or coupling means) attached to the substrate on a surface of the substrate opposite the glass, thereby providing the ability to couple the reinforced tile with a modular wall and/or reconfigurable wall system.

As used herein, the terms "reinforced panel," "reinforced glass panel," "reinforced panel," "reinforced tile," "modular tile," "modular panel," or similar terms refer to a surface, tile, panel, sheet, or other structure joined at least partially to a substrate material. Although embodiments described herein typically refer to glass, it should be noted that other materials such as thermofoil materials or materials subject to cracking, breaking, and particularly to shattering (e.g., ceramics, certain resins and polymers, etc.) are also included within the scope of each disclosed embodiment as alternative embodiments.

Substrate materials may be formed from any suitable material providing a strengthening and/or reinforcing support to the glass and/or providing easier and stronger fastening of connectors or other hardware. Additionally, or alternatively, substrates may be formed of a material providing strength (e.g., granite or other stone materials, or wood or the like), fire resistance (e.g. drywall), or aesthetics (e.g. designed panels). For example, the substrate may be a polymer film or polymer sheet material providing greater flexibility and resilience relative to the glass, such that any spreading of shattered glass (e.g., if dropped or struck) is limited or prevented by the flexible backing and/or other support provided by the substrate. In another example, substrate materials may be more rigid and/or more resistant to torsional, compressive, tensile, and/or other forces than the glass panel, thereby preventing the glass panel from bending, twisting, stretching, and/or compressing to a breaking point after attachment to the substrate.

Other suitable substrate materials include foils, resins, metals, woven or nonwoven fabrics, stone, drywall, and/or other materials selected to provide enhanced functionality of the panel. In some embodiments, a substrate is formed from a particle board such as medium density fiberboard ("MDF"). In some embodiments, a substrate is formed as a laminate, such as a low pressure laminate ("LPL"), high pressure laminate ("HPL"), and/or other melamine-type laminate material. In some embodiments, the substrate is formed of a material that is resistant to warping and/or other shape changing effects over time. For example, the substrate may be formed of a material that is resistant to humidity, does not absorb water, and/or otherwise substantially maintains size and shape in humid environments (e.g., outdoor environments and/or indoor environments).

In some embodiments, substrate materials have a thickness ranging from about 0.1 inches to about 5 inches, or about 0.15 inches to about 3 inches, or about 0.2 inches to about 1 inch, or about 0.25 inches to about 0.75 inches, or a thickness of about 0.5 inches.

In some embodiments, a reinforced panel is formed by joining a glass layer to a substrate by adhesion. For example, an adhesive may be applied to a mating surface of the glass panel, a mating surface of the substrate, or to both. Additionally, or alternatively, an adhesive sheet or film may be disposed between the glass layer and the substrate to form the reinforced panel. In some embodiments, the substrate and the glass panel have substantially the same shape, and are substantially aligned when joined to form a reinforced panel of substantially the same shape. In other embodiments, the glass layer and/or substrate are offset and/or may be of different shapes. In such embodiments, less than all of the surface of the glass panel and/or substrate on the adjoining side is covered by the opposing component.

FIG. 1 illustrates an embodiment of a reinforced panel 10 having a glass layer 12 and a substrate 14 joined to the glass layer 12. In some embodiments, the glass layer 12 is painted, etched, digitally printed, or otherwise modified before being joined to the substrate 14. For example, when transparent or semi-transparent glass is used, the side of the glass layer 12 facing and joining the substrate 14 may be painted and/or digitally printed to provide a desired color or other aesthetic or functional effect before forming the reinforced panel 10.

The illustrated reinforced panel 10 also includes connectors 18 attached to the substrate 14 on a surface of the substrate 14 opposite the glass layer 12. The connectors 18 may be adhesively connected and/or mechanically fastened (e.g., using screws, nails, rivets, or other fasteners). Such connectors 18 may be used to connect the reinforced tile 10 to a modular wall, as explained below.

Figure 2:
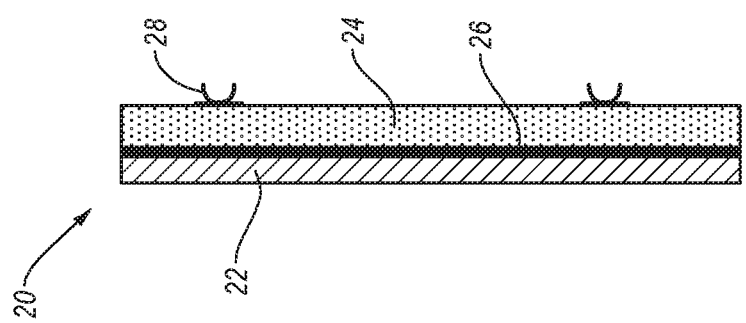
FIG. 2 illustrates a reinforced panel including a glass panel and a substrate with connectors and a film disposed between the panel and substrate.

FIG. 2 illustrates another embodiment of a reinforced panel 20 having a glass layer 22 and a substrate 24, with connectors 28 joined to the substrate 24. The illustrated reinforced panel 20 also includes a film 26 disposed between the glass layer 22 and the substrate 24. The film 26 may be a decorative or a functional film providing a desired background or change in opacity to the appearance of the tile 20, for example.

Although all of the panels disclosed herein are not explicitly described or illustrated as including film, similar or identical to film 26, it will be appreciated that any of the disclosed panels could include such a film.

Figure 3:
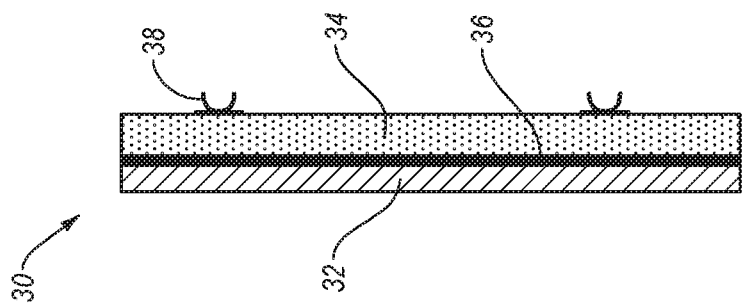
FIG. 3 illustrates a reinforced panel including an intermediate layer disposed between a substrate and a glass layer.

FIG. 3 illustrates another embodiment of a reinforced panel 30 having a glass layer 32 and a substrate 34, with connectors 38 joined to the substrate 34. The illustrated reinforced panel 30 also includes an intermediate layer 36 disposed between the glass layer 32 and the substrate 34. The intermediate layer 36 is configured to compensate for differences in material properties between the glass layer 32 and the substrate 34. For example, some embodiments include a substrate layer 34 having a different coefficient of thermal expansion relative to the glass layer 32. In such embodiments, changes in temperature and/or humidity can lead the substrate 34 and the glass layer 32 to change size (e.g., expand or contract) at different rates and/or with different magnitudes, subjecting the separate components to tensile and/or compressive forces. In the absence of one or more intermediate layers 36 configured to absorb the impact of the resulting tensile or compressive forces, one or more of the components of the reinforced panel (e.g., the glass layer) will often crack or will have a reduced lifetime prior to cracking. Certain embodiments of intermediate layers 36 are configured to provide a buffer for absorbing or deflecting the compressive and tensile forces arising between the substrate 34 and the glass layer 32.

Beneficially, such embodiments enable the use of panel components with differing material properties (e.g., differing coefficients of thermal expansion) while avoiding detrimental breakage otherwise associated with such an arrangement. For example, some embodiments may include a substrate 34 selected so as to provide one or more desired characteristics (e.g., strength, rigidity, magnetic capabilities, flexibility, visual appearance), and a glass layer 32 selected to augment the desired characteristics and/or selected so as to optimize a separate desired characteristic. The use of one or more intermediate layers 36 allows these selections to be made without the constraints of matching coefficients of thermal expansion, enabling a wider selection of compatible components and enabling the full benefits of each selected component to be realized without an associated tradeoff of increasing breakage risk.

In addition, the reinforced panel 30 including one or more of such intermediate layers 36 beneficially enables operational use of the panel 30 within a wider range of environments than would otherwise be available. For example, a reinforced panel without an intermediate layer may only be functional within a narrow temperature range and will be subject to breakage when placed outside of that temperature range or when placed in an environment with a higher degree of temperature fluctuation. In contrast, a panel having one or more force buffering intermediate layers will enable greater versatility of use and performance in a greater variety of environments.

In some embodiments, the one or more intermediate layers are formed by using a material configured to provide sufficient elastic deformation such that when different levels of expansion and/or contraction between the substrate and the glass layer create tensile and/or compressive forces, the tensile and/or compressive forces are absorbed by deformation in the one or more intermediate layers as opposed to being applied within the substrate and/or glass layer. Examples of suitable intermediate layers include various polymers, flexible adhesives, flexible ceramics, flexible porcelain, and/or other materials capable of providing desired levels of elastic deformation.

In some embodiments, the intermediate layer is formed from a porcelain material configured to provide for relative expansion and contraction between the glass layer and the substrate. In one example, a porcelain intermediate layer is joined to a metal (e.g., steel) substrate. Such an embodiment is beneficially able to provide magnetic surface functionality to the reinforced panel. In addition, the porcelain intermediate layer provides a smooth surface for joining the glass layer and/or other layers to the substrate (e.g., preventing imperfections in the metal substrate from telegraphing through to the applied glass layer and thereby resulting in a wavy or otherwise distorted effect). Further, although the metal substrate and the glass layer have relatively very different coefficients of thermal expansion, the one or more intermediate layers (in this particular embodiment, a porcelain layer joined to the metal substrate) enables the separate components to be used together in an integrated, reinforced panel without the expected rates of cracking and breakage, and without the expected limits to temperature and operational environments, typically associated with the use of materials of such relatively disparate coefficients of thermal expansion. While the foregoing embodiment utilizes a porcelain intermediate layer, other embodiments may include one or more intermediate layers formed from other suitable materials, such as other ceramics configured to provide a smooth surface for the joining of the glass layer and which provide sufficient buffering of compressive and tensile forces between the substrate and the glass layer.

Additionally, or alternatively, other embodiments include a substrate having a coefficient of thermal expansion that is substantially matched to the coefficient of thermal expansion of the corresponding glass layer. For example, certain HPL materials have been found to provide a coefficient of thermal expansion that substantially coincides with the coefficient of thermal expansion of associated glass layers within temperature ranges and fluctuations of a typical environment of use. In one example, an HPL substrate is adhered to a glass layer formed of a thin (e.g., about 200 μm) and flexible layer of glass, such as glass having the trade name Willow® Glass, available from Corning®. These and other types of glass may also be used in other embodiments of reinforced panels described herein.

Although all of the panels disclosed herein are not explicitly described or illustrated as including an intermediate layer similar or identical to intermediate layer 36, it will be appreciated that any of the disclosed panels could include such an intermediate layer that provides at least some of the benefits described herein.

The reinforced tiles of the present disclosure may be integrated as part of a modular and/or reconfigurable wall. Embodiments of modular walls are taught in U.S. Pat. No. 8,024,901, and in U.S. Patent Application No. 62/133,569, each of which are incorporated herein in their entirety.

II. Methods of Manufacture of Reinforced Tiles

In some embodiments, a reinforced panel can be formed by sizing a glass layer to be larger than the substrate to which it is to be attached. For example, a glass layer can be sized so as to extend beyond each edge of the adjoined substrate. In preferred embodiments, a glass layer is sized so as to extend beyond each edge of the adjoined substrate by about 7.5 mm. For example, a glass layer having a length that is about 15 mm longer than a length of the associated substrate and a height that is about 15 mm higher than a height of the associated substrate can be positioned against (e.g., centered upon) the substrate such that about 7.5 mm of the glass layer extend beyond each edge of the substrate. In other embodiments, a glass layer can be sized so as to extend beyond one or more edges of an adjoined substrate by about 1 to 15 mm, or about 2.5 to 12.5 mm, or about 5 to 10 mm, or by a distance greater than 15 mm.

From such a configuration, the one or more portions of the glass layer extending beyond the one or more edges of the substrate can be removed so as to leave the glass layer with a size that substantially matches the size of the adjoining substrate. For example, in some embodiments, the glass layer may be scored along the edges of the substrate before breaking off the overhanging portion(s) of the glass layer. Such scribing may be accomplished using a glass cutting tool, such as a wheel scribe and/or glass cutting blade (e.g., circular saw blade, hand held blades). In some embodiments, the glass layer is cut so that the underlying substrate extends beyond the glass layer at one or more edges (e.g., by about 0.1 to 1 mm, or about 0.25 to 0.75 mm, or about 0.5 mm). This can beneficially reduce the formation of cracks or other edge damage at the edges of the glass layer.

Figure 4:
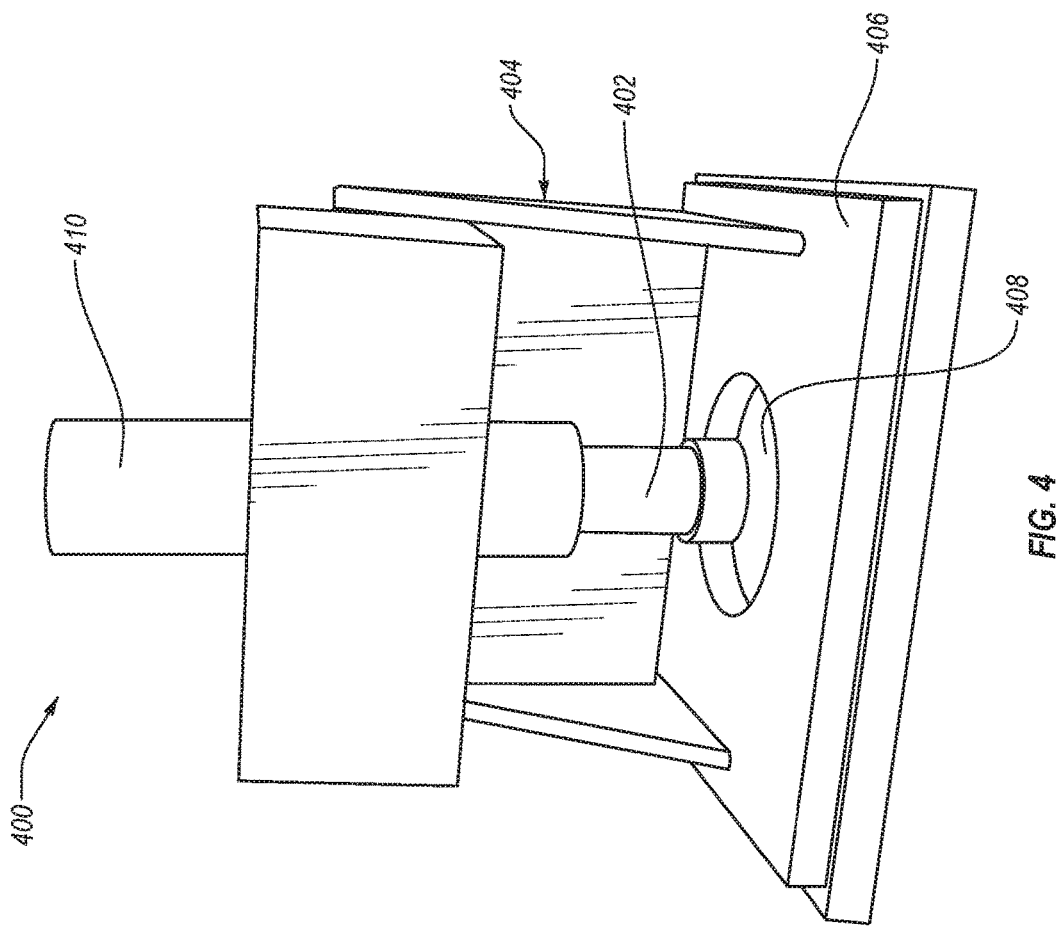
FIGS. 4 to 6 illustrate an embodiment of a trimming tool including a spring loaded scribing tool positioned within a router housing.
Figure 5:
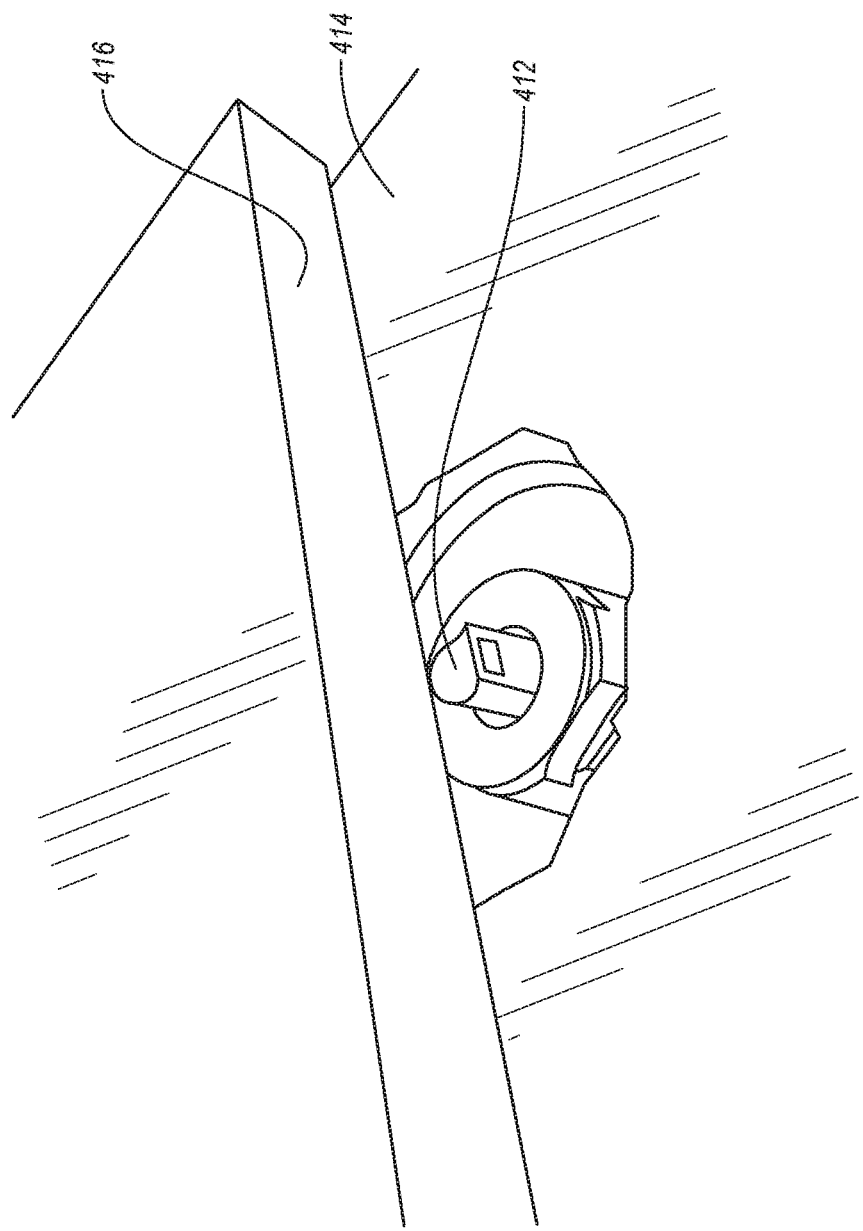
Figure 6:
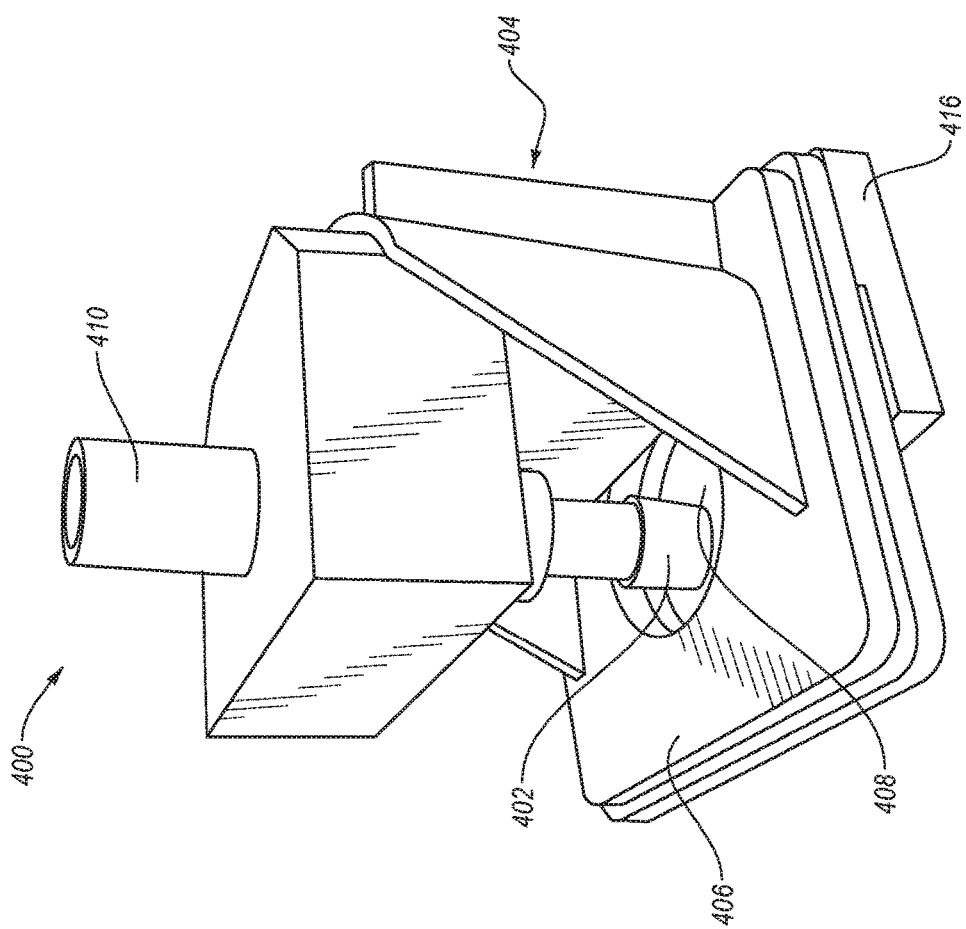

In preferred embodiments, scribing of the glass is accomplished using a trimming device (e.g., a mechanically powered trimming device). The embodiment illustrated by FIGS. 4-6, for example, shows a trimming device 400 that includes a scribing tool 402 (e.g., a router bit configured for scribing glass) coupled to a router housing 404. FIGS. 4 and 6 illustrate front and side views of the trimming device 400, respectively, and FIG. 5 illustrates a bottom view of the trimming device 400.

The illustrated embodiment includes a scribing tool 402 that is spring-loaded within the router housing 404. In this embodiment, the scribing tool 402 is configured to be resiliently biased downward toward the illustrated bottom section 406 when in a default position, with the cutting section 412 of the scribing tool 402 extending through the aperture 408 such that the cutting section 412 is exposed on the bottom side 414 of the device 400 (best seen in FIG. 5). The scribing tool 402 is also configured to flex upward (e.g., toward the illustrated upper section 410) when subjected to an upwards force. The illustrated embodiment also includes an alignment piece 416 configured in size, shape, and position to enable proper positioning of the object to be cut (e.g., a glass layer) relative to the cutting section 412. In some embodiments, the alignment piece 416 is configured to be repositionable, removable, and/or interchangeable with separate alignment devices or structures.

In at least some implementations of the illustrated embodiment, passing the trimming device 400 over surface variations in a glass layer (e.g., bumps, ridges, depressions, defects, and/or other abnormalities) causes the scribing tool 402 to move and/or flex to compensate for the change in surface contact with the glass layer so as to provide a more uniform scribe (e g, uniform in depth) along the targeted scribing area.

The devices and methods described above can provide a variety of advantages. For example, joining an oversized glass layer to a substrate prior to removing the oversized portions of the glass layer can allow formation of a reinforced panel with reduced or eliminated chips, shards, rough edges, and/or edge related defects. Forming a substrate to a desired size and shape prior to attaching a glass layer can allow edge-finishing processes to be applied to the substrate without affecting an adjacent glass layer edge. Subsequent scribing and removal of overhanging sections of the attached glass layer can allow for a clean break of the glass with reduced or eliminated risk of introducing undesirable cracks, shards, and/or rough edges to the glass edges, for example. For example, use of a spring-loaded scribing tool positioned within a router housing can provide a substantially uniform scribe, leading to cleaner breaks at the glass edges.

In some embodiments, the glass layer is configured to be rollable. For example, certain materials may be selected having properties (e.g., thickness and/or flexibility) allowing sheet shaped portions of the glass to be obtained in a rolled form. One or more rolls can then be unrolled prior to positioning of the surface upon a substrate. In some embodiments, one or more glass layers are obtained in a rolled form. In such embodiments, the glass layers may be unrolled and then painted on one or more sides. For example, as described above, one or more sides of a glass layer may be painted so as to provide a functional and/or aesthetic benefit to the glass prior to joining the glass layer to a substrate.

In some embodiments, a glass layer may be unrolled, painted, and then joined to a substrate. In other embodiments, one or more glass layers may be unrolled, painted, and then re-rolled for subsequent joining to a substrate. For example, in some manufacturing processes, it may be more efficient to produce a stock of prepared glass layers having a required and/or desired painting. Such a stock may be more efficiently stored and handled if re-rolled rather than left in an unrolled configuration. For example, it may be easier to orient a glass layer relative to a substrate to be attached to the glass layer if the glass layer is in a rolled configuration. In this manner, the proper positioning of the glass layer onto the substrate may be accomplished by unrolling the glass layer along the substrate in the proper direction (e.g., so as to position the painted side against the substrate), as opposed to maneuvering a glass layer having a shape with a larger footprint.

III. Touch-Responsive Reinforced Tiles

Figure 7:
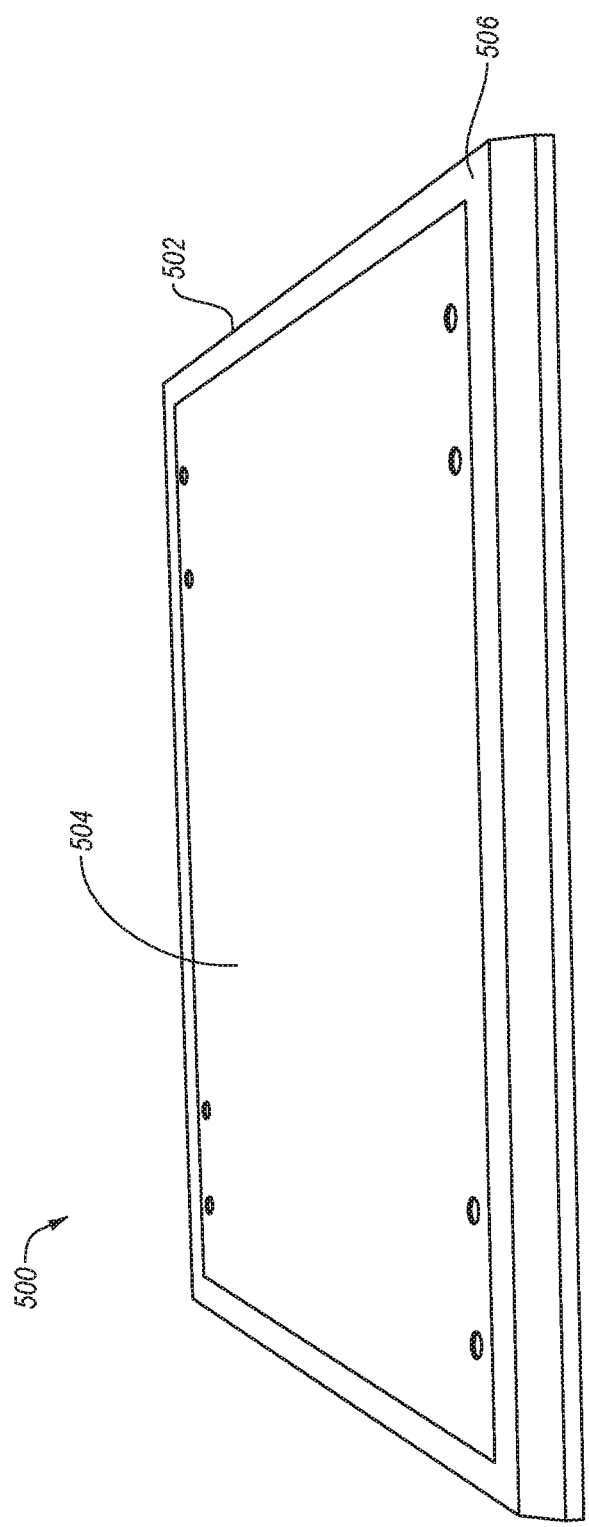
FIGS. 7 and 8 illustrate an embodiment of a substrate with an applied conductive coating, the substrate being suitable for use in a touch-responsive reinforced panel.
Figure 8:
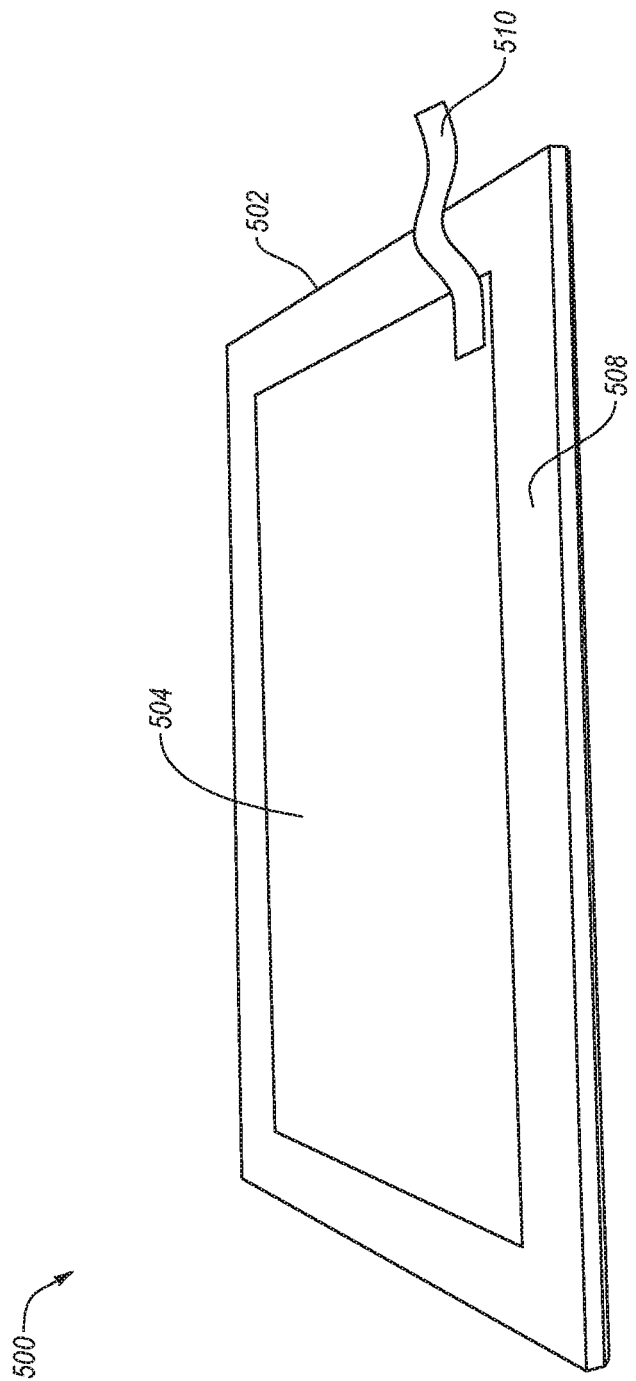

Some embodiments of reinforced panels are configured to include one or more touch-responsive sections. For example, a substrate may be coated with a conductive material before a glass layer is applied to the substrate. FIGS. 7 and 8 illustrate a panel 500 having a substrate 502 (e.g., an MDF substrate) partially coated with a conductive material 504 (e.g., a graphite dry lubricant material) on a bottom surface 506 (FIG. 7) and a top surface 508 (FIG. 8). Alternatively, the bottom surface 506 or the top surface 508 omits the conductive material 504, such that only one surface includes the conductive material 504. As best shown in FIG. 8, a connector 510 is joined to the substrate so as to be in contact with and to extend from the section coated with the conductive material 504. In the illustrated embodiment, the connector 510 is formed as a section of copper tape. Additionally, or alternatively, other types of connectors may be used, including metals, metal-alloys, conductive inks, and the like. The connector 510 can be configured to extend from the substrate to a controller (not shown).

One or more surfaces (not shown) may be applied to the substrate 502 to form a touch-responsive panel. For example, a thermofoil material, glass material, resin, or thermoplastic may be applied to at least one of the surfaces (such as the top surface 508 of the substrate 502 of the illustrated panel 500). In such a configuration, a user's touch to the surface can alter one or more of the electrical properties of the underlying conductive material 504 (e.g., the capacitance of the conductive material 504). For example, a change in the capacitance of a section of the conducting material 504, caused by a user touching the surface, may be signaled to the controller via the connector 510.

The illustrated embodiment includes a graphite dry lubricant material as the conductive material 504. Additionally, or alternatively, the conductive material may be formed from other carbon materials, copper, metallic paint, and/or other conducting materials. In some embodiments, the conductive material 504 is formed at least partially from a conductive ink configured to be printed upon a surface in a desired pattern or configuration. In some embodiments, the conducting material 504 is formed as a spray, liquid, paint, powder, or other such composition providing ease of application to a substrate.

The illustrated embodiment includes a single section of copper tape as the connector 510. Additionally, or alternatively, one or more connectors may be formed from wire, tape, and/or other structures formed of copper or any other conductive material.

In some embodiments, a touch-responsive reinforced panel is divided into a plurality of separate touch-responsive sections. For example, prior to application of the conductive material 504 to the substrate 502, the substrate 502 can be divided into two or more sections by applying tape (e.g., painter's tape) or other dividing or delineating material or structure so as to divide the substrate into the desired sections. The tape or other dividing material is then removed after application of the conductive material, thereby providing a break in the electrical connection between adjacent touch-responsive sections of the panel. One or more connectors extending to a connector are then applied to each of the separate touch-responsive sections. Alternative to, or in addition to, using tape as a means of defining separate touch-responsive sections, one or more overlays, grids, barriers, and/or other structures may be positioned on the substrate prior to application of the conductive material. In some embodiments, conductive material is removed from the substrate after application in order to define or further define the separate touch-responsive sections.

In some embodiments, the controller is configured to provide a variety of outputs in response to received inputs from the touch-responsive reinforced panel. For example, one or more touch-responsive sections may be configured to control on/off switching of one or more lights. Additionally, or alternatively, such sections can be configured to control the brightness of a light. For example, in response to a user maintaining a touch at a touch-responsive section, the controller can progressively brighten or progressively dim an associated light.

A variety of other functions may additionally or alternatively be provided. For example, the controller can be configured to actuate, adjust, or otherwise control one or more connected devices according to a signal count (e.g., number of taps by a user) to a pre-determined touch-responsive section, or to actuate, adjust, or otherwise control one or more connected devices according to an order of input received at the plurality of touch-responsive sections. In some embodiments, one or more touch-responsive sections may be associated with one or more alphanumeric characters, users, colors, light brightness levels, temperature settings, or other form of information input. One of skill in the art will recognize that these examples are not intended to be limiting, and that other embodiments can be configured to provide a variety of outputs and/or responses to electrical signals received at the controller.

IV. Integration with Modular Wall

The reinforced panels described in the above sections may be used with various wall modules or in conjunction with various wall modules. In the embodiments illustrated in FIGS. 9-14, the various wall modules and panels can all be configured to be or to include reinforced tiles as described above.

Figure 9:
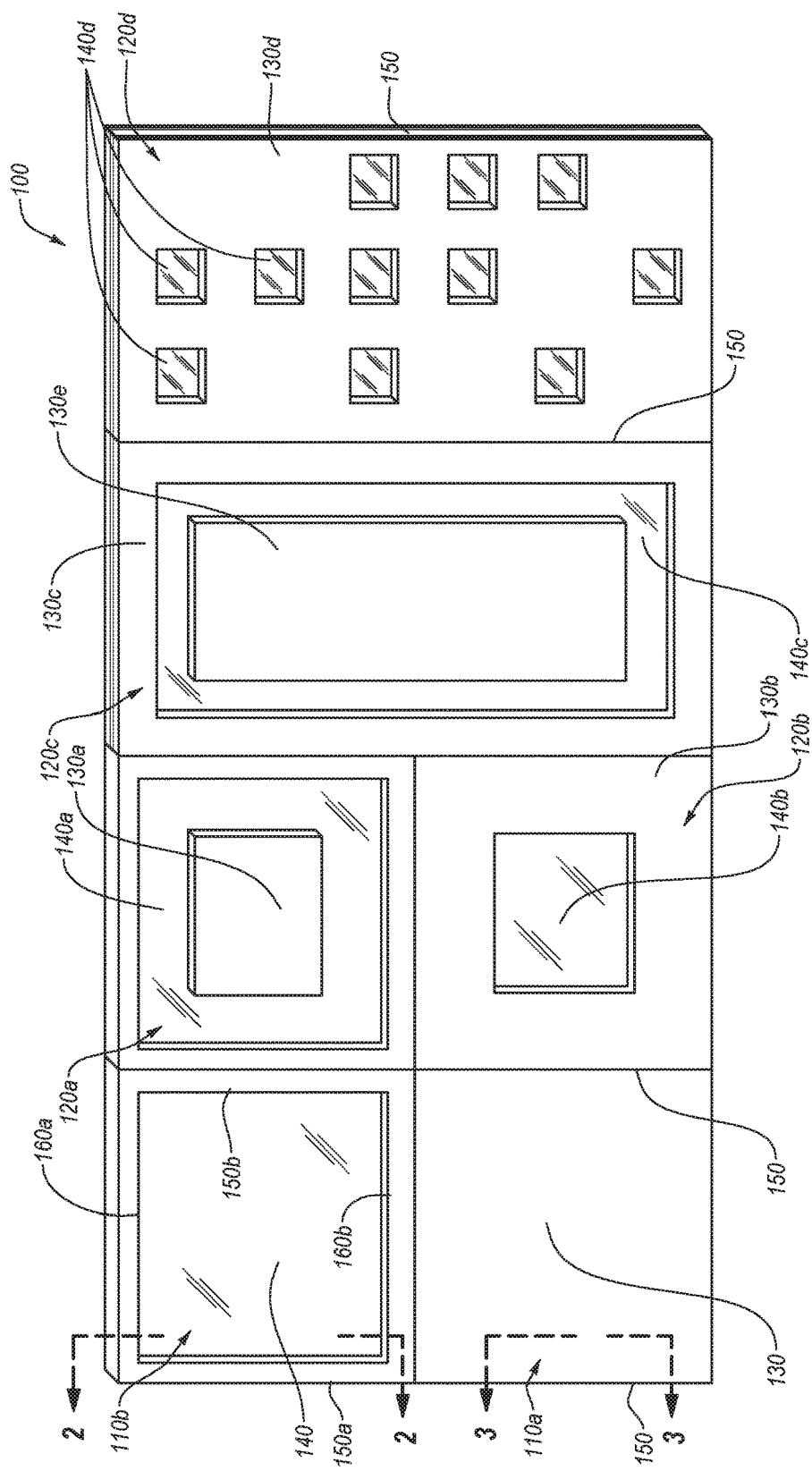

For example, as illustrated in FIG. 9, a modular wall system 100 can incorporate one or more wall modules. The wall modules can comprise face-mounted wall modules 110a, center-mounted wall modules 110b, or nested wall modules 120a, 120b, 120c, 120d. The face-mounted wall modules 110a can include a pair of face-mounted panels 130 supported by a frame support. The center-mounted wall modules 110b can comprise a center-mounted panel 140 supported by a support frame. The nested wall modules 120a-d can have various configurations, incorporating one or more face-mounted panels 130a-e as well as one or more center-mounted panels 140a-d. Nesting of the face-mounted and center-mounted panels 130a-e, 140a-d can provide additional functionality as well as desirable aesthetics to the nested wall modules 120a-d and to the modular wall system 100. In these embodiments, the wall modules and panels can be or can include reinforced tiles described above.

In one or more implementations, the center-mounted panels 140a-d and/or the face-mounted panels 130a-e can comprise transparent and/or translucent material, such as thermoplastic resin and/or glass. Accordingly, the center-mounted panels 140a-d can allow one to see through the nested wall modules 120a-d or center-mounted wall modules 110b. In other words, in one or more implementations, the center-mounted panels or tiles 140a-d can comprise windows. Additionally, an installer or designer can adjust window area. For instance, the designer can determine the window area based on the shape and size of the transparent or translucent portions of the center-mounted panels 140a-d. The designer also can define the window area by adjusting the transparent and/or translucent properties of the transparent and/or translucent material (e.g., by etching a portion of a transparent center-mounted panel 140a-d).

Thus, the designer can form the modular wall system 100 to provide a desired level of privacy to the users. In particular, the designer can choose and/or arrange the center-mounted and face-mounted wall modules 110a, b and the nested wall modules 120a-d in the modular wall system 100, which can determine the window areas. Similarly, the designer can choose and/or arrange the face-mounted panels 130 and the center-mounted panels 140a-d in the nested wall modules 120a-d to define window areas.

It should be noted, however, that the nested wall modules 120a-d can incorporate one or more nested face-mounted panels 130a-e and center-mounted panels 140a-d for other decorative, aesthetic, and functional purposes. For instance, the center-mounted panels 140a-d and/or face-mounted panels 130a-e may comprise opaque material thereby preventing visibility through the nested wall modules 120a-d entirely. Alternatively, the center-mounted panels 140a-d and face-mounted panels 130a-e can comprise transparent and/or translucent material, which may allow the user to see through portions of the modular wall system 100.

One will appreciate in light of the disclosure that the nested wall modules 120a-d can have almost limitless configurations. For example, the nested wall module 120a includes a pair of face-mounted panels 130a nested within a center-mounted panel 140a. As shown, the center-mounted panel 140a can surround and support the pair of face-mounted panels 130a nested therein. In one or more implementations, the center-mounted panel 140a completely surrounds and supports the pair of face-mounted panels 130a nested therein. As explained below, the center-mounted panel 140a can comprise a hole within which the pair of face-mounted panels 130a are mounted.

One will appreciate that the pair of face-mounted panels 130a can comprise any number of different aesthetic or functional purposes. For example, in one or more implementations the nested pair of face-mounted panels 130a can comprise an outset aesthetic detail. For example, the nested pair of face-mounted panels 130a can comprise a painting, sign (e.g., office name plate, bathroom sign, or other sign). In other implementations, the nested pair of face-mounted panels 130a can comprise a fold down shelf or other functional feature.

In contrast to nested wall module 120a, nested wall module 120b includes a center-mounted panel 140b nested within a pair of face-mounted panels 130b. As shown, the pair of face-mounted panels 130b can surround and support the center-mounted panel 140b nested therein. In one or more implementations, the pair of face-mounted panels 130b completely surrounds and supports the center-mounted panel 140b nested therein. As explained below, the pair of face-mounted panels 130b can comprise a hole within which the center-mounted panel 140b is mounted.

One will appreciate that the center-mounted panel 140b can comprise any number of different aesthetic or functional purposes. For example, in one or more implementations the nested center-mounted panel 140b can comprise an inset aesthetic detail. For example, the nested center-mounted panel 140b can comprise a painting, sign (e.g., office name plate, bathroom sign, or other sign). Alternatively, the nested center-mounted panel 140b can comprise a stain glass window or other aesthetic detail. In other implementations, the nested center-mounted panel 140b can comprise a fold down shelf or other functional feature.

In addition to the foregoing, the nested wall modules can include more than one layer of nesting. For example, nested wall module 120c includes a pair of face-mounted panels 130e nested within a center-mounted panel 140c, which in turn is nested within another pair of face-mounted panels 130c. As shown, the pair of face-mounted panels 130c can surround and support the center-mounted panel 140c, which in turn can surround and support the pair of face-mounted panels 130e. In yet further implementations, the nested wall modules can include a center-mounted panel nested within a pair of face-mounted panels, which in turn are nested within another center-mounted panel. In still further implementations, the nested wall modules can include three, four, five, or more layers of nesting.

In addition to multiple layers of nesting, one or more implementations of the present invention can also include multiple panels nested within a single panel. For example, the nested wall module 120d includes a plurality of center-mounted panels 140d nested within a single pair of face-mounted panels 130d. Thus, one will appreciate that implementations of the present invention can provide nested wall modules with great aesthetic and functional versatility.

Additionally, as shown by FIG. 9, the nested center-mounted panels 140b, 140c, 140d can have substantially the same shape and size as the shape and size of an opening in the face-mounted panels 130b, 130c, 130d which support the nested center-mounted panels 140b, 140c, 140d. More specifically, a rectangular center-mounted panel 140c of a certain size may nest within the face-mounted panels 130c that has a rectangular opening of substantially the same size. Hence, the face-mounted panels 130b, 130c, 130d can have a substantially seamless interface with the center-mounted panels 140b, 140c, 140d nested therein. Similarly, nested pairs of face-mounted panels 130a, 130e can have substantially the same shape and size as the shape and size of an opening in the center-mounted panels 140a, 140c which support the nested pairs of face-mounted panels 130a, 130e. Therefore, the center-mounted panels 140a, 140c can have a substantially seamless interface with one or more nested pairs of face-mounted panels 130a, 130e.

FIG. 9 illustrates both square and rectangular shaped panels and wall modules. One will appreciate that the present invention is not so limited. In alternative implementations, the center-mounted panels 140a-d and/or face-mounted panels 130a-e, can include triangular, pentagonal, hexagonal, octagonal, circular, oval, or more complex shapes. Similarly, the wall modules can comprise shapes other than squares or rectangles.

The wall modules 110a-b, 120a-d can further include a support frame. The support frame can provide structural support to the face-mounted panels 130a-e and/or to the center-mounted panels 140a-d. In particular, the support frame can support the outer-most panels or tiles of the wall module 110a-b, 120a-d. The support frame of each wall module 110a-b, 120a-d can comprise a pair of upright supports 150, and one or more cross members extending therebetween. The distance between the upright supports 150 and can define, at least in part, a width of the wall modules 110a-b, 120a-d.

As shown by FIG. 9, in one or more implementations the face-mounted panels 130 can extend across and conceal the support frame supporting them from a facing view. On the other hand, the upright supports 150a, 150b and cross-members 160a, 160b of a center-mounted panel 140, including glass panel 141a and substrate 141b, may be exposed. In any event, the face-mounted panels 130a-e and/or the center-mounted panels 140a-d can couple to the upright supports 150 and/or to the cross-members, forming the support frame. As shown by FIG. 9, the face-mounted panels 130a-e and/or the center-mounted panels 140a-d are secured between the upright supports of their respective wall module 110a-b, 120a-d.

Figure 10:
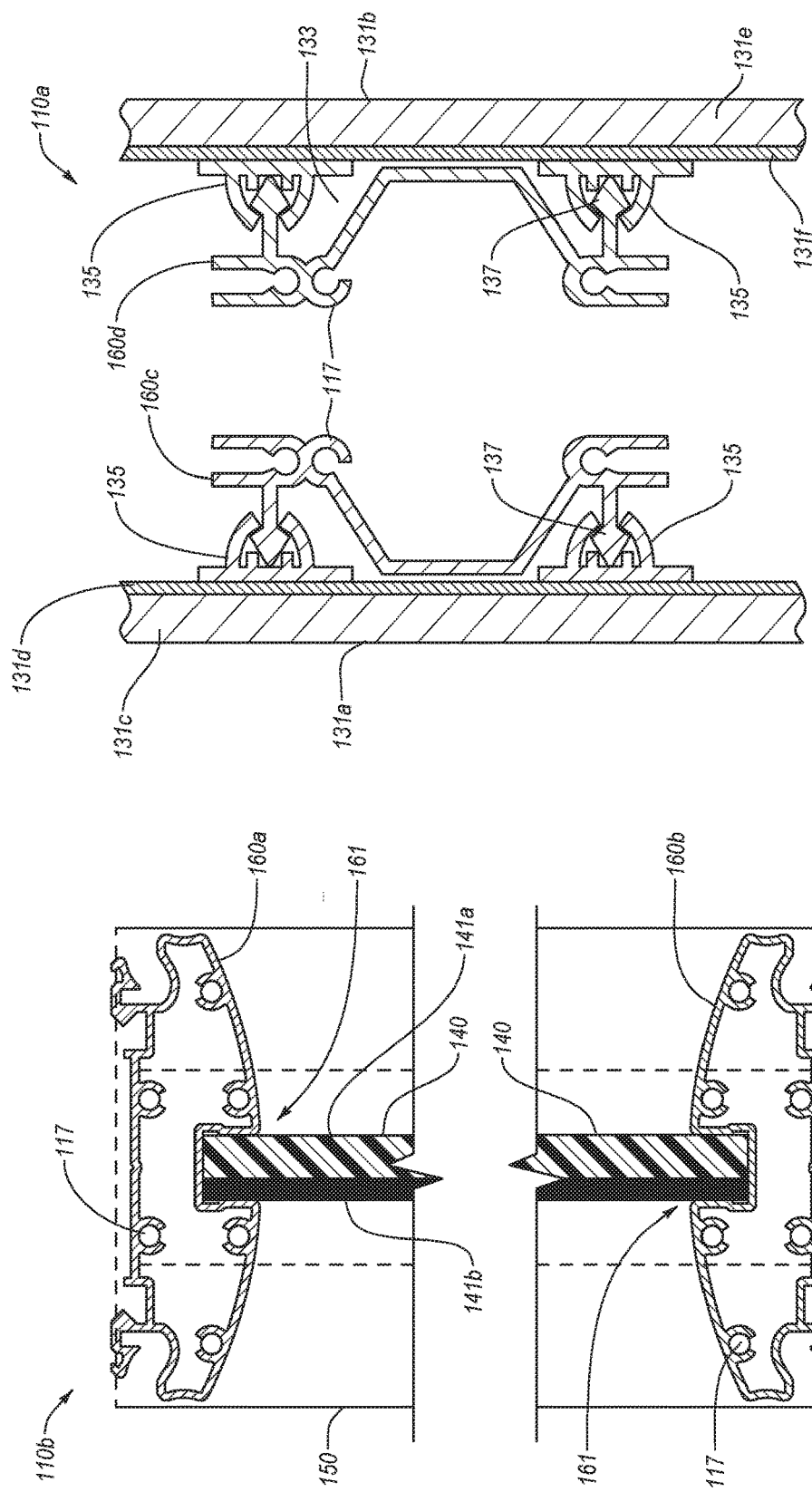

For example, FIG. 10 illustrates a cross-sectional view of the center-mounted wall module 110b. As shown by FIG. 10, the support frame can comprise an upper cross member 160a and a lower cross member 160b. The center-mounted panel 140 can extend between the upper cross-member 160a and the lower cross member 160b. In particular, each of the cross-members 160a, 160b can include a panel mounting channel 161 sized and configured to hold and support an edge of the center-mounted panel 140. Similarly, the upright supports 150a, 150b can include panel mounting channels 161 sized and configured to hold and support an edge of the center-mounted panel 140.

One will appreciate that the center-mounted panel of wall modules in which a center-mounted panel 140 is the outer-most panel (such as wall modules 110b and 120a), can include a support frame similar to that shown in FIG. 10. Thus, when a center-mounted panel 140 is the outermost panel, the center-mounted panel can extend between the first and second upright supports 150a, 150b and between the upper cross-member 160a and the lower cross member 160b. Thus, the support frame of a nested wall module can directly attach to and support the outermost panel(s) of the nested wall module. As explained below, the outermost panel(s) can then support any nested panels.

Figure 11:
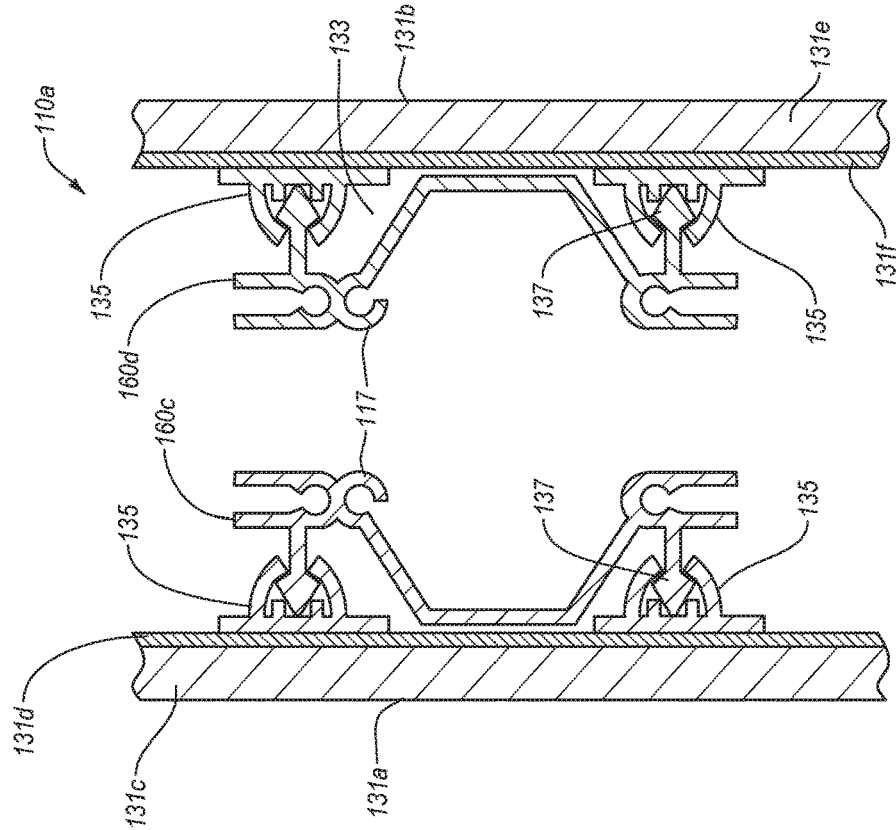

Referring now to FIG. 11, a cross-sectional view of the face-mounted wall module 110a of FIG. 9 is shown. The face-mounted wall module 110a can incorporate a first face-mounted panel 131a (e.g., a front tile formed with a glass panel 131c and a substrate 131d) and a second face-mounted panel 131b (e.g., a back tile formed with a glass panel 131e and a substrate 131f)) mounted to opposing sides of the vertical supports 150 and/or of the cross-members 160. Accordingly, the panels 131*a*, 131*b* can define an interior space 133 within the wall module 110*a*.

As shown by FIG. 11, the support frame of the face-mounted wall module 110*a* can include one or more cross-members 160*c*, 160*d*. The cross-members 160*c*, 160*d* can extend between upright supports. The cross-members 160*c*, 160*d* can each include one or more engagement protrusions 137. In one or more implementations, the engagement protrusion 137 comprises an arm with a head attached to the end. For example, FIG. 11 illustrates an arrow-shaped head. The panels 131*a*, 131*b* can in turn include clips or connectors 135 including flexible arms that clip or snap about the head of engagement protrusions 137 to secure the panel 131*a*, 131*b* to the respective cross-member 160*c*, 160*d*. In particular, the flexible arms of the clips 135 can surround at least a portion of the head of the engagement protrusion 137.

The ability to clip the panel 131*a*, 131*b* to a support frame of a wall module 110*a* can allow a user to selectively remove, move, or reconfigure the position a panel within a given modular wall system. In alternative implementations, the panels 131*a*, 131*b* may not include clips 135. In such implementations, a user can fasten the panels 131*a*, 131*b* directly to the cross-members 160*c*, 160*d* via screws or other fasteners. One will appreciate that such implementations can allow a user to retro fit a given wall module with a nested wall module.

One will appreciate that the face-mounted panels of wall modules in which a pair of face-mounted panels 130 is the outermost panel (such as wall modules 110*a* and 120*b-d*), can include a support frame similar to that shown in FIG. 11. Thus, when a pair of face-mounted panels 130 is the outermost panel, the pair of face-mounted panels 130 can extend between the first and second upright supports 150 and between and across the cross-members 160*c*, 160*d*. Thus, the support frame of a nested wall module can directly attach to and support the outermost panel(s) of the nested wall module. As explained below, the outermost panel(s) can then support any nested panels.

As shown by FIGS. 10 and 11, each of the cross members 160*a-d* can also optionally include one or more mounting holes 117. The mounting holes 117 can allow a user to secure the cross members 160*a-d* to the upright supports 150 or other hardware. Additionally or alternatively, the vertical supports 150 also can include T-slots, and an assembler can insert a double T joining member to join two vertical supports 150. It should be noted, that joining the upright supports 150 of the wall modules 110*a*, 110*b*, 120*a-d*, one to another, can join the respective wall modules 110*a*, 110*b*, 120*a-d* one to another.

Figure 13:
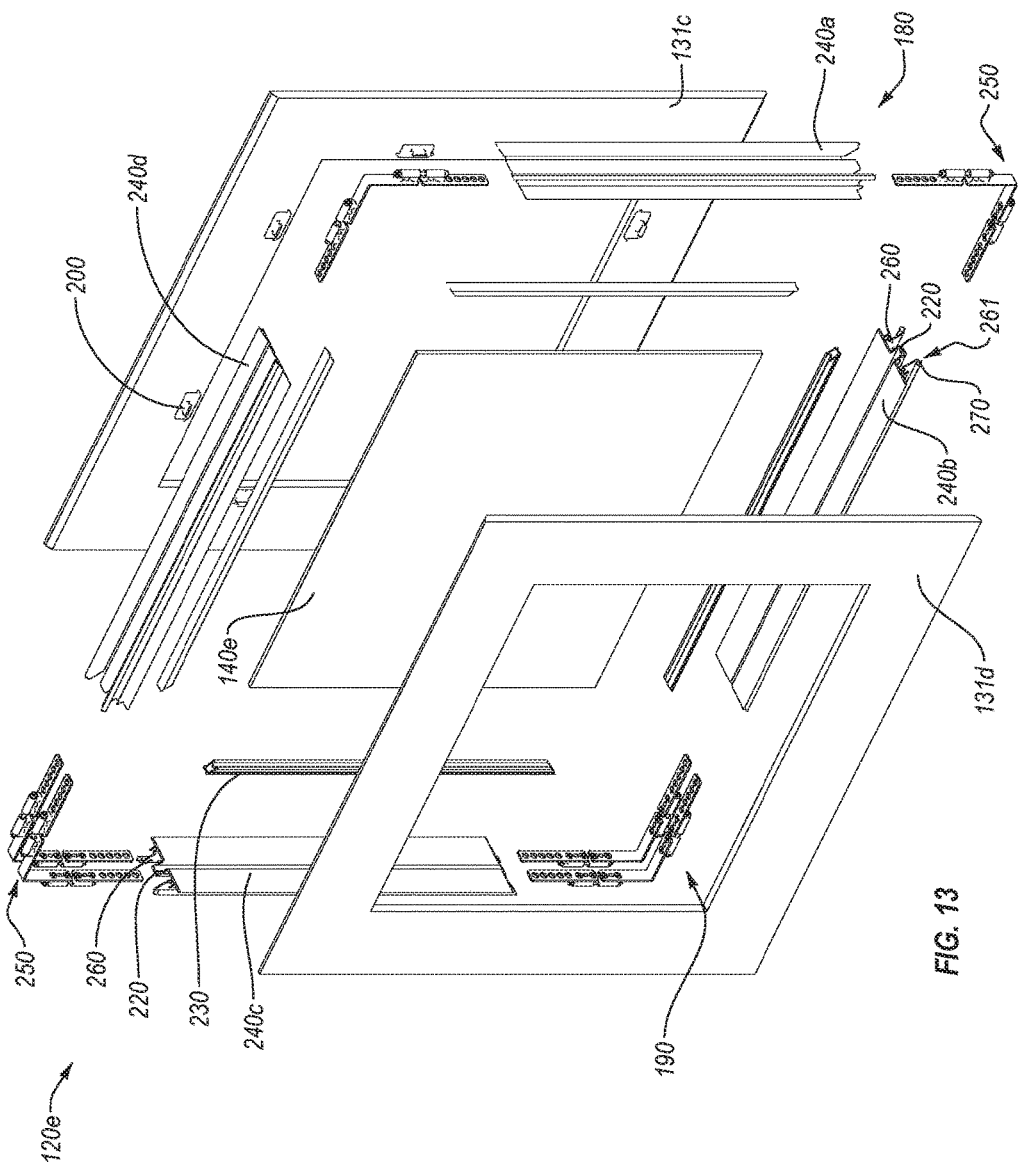

FIGS. 12 and 13 respectively illustrate perspective exploded and assembled views of a portion of a nested wall module 120*a* including a center-mounted panel 140*a* nested within a pair of face-mounted panels 131*a*. More specifically, the nested wall module 120*a* incorporates the first and the second face-mounted panels 131*c*, 131*d*. The first and the second face-mounted panels 131*c*, 131*d* can include an opening 190, which can accommodate the nested center-mounted panel 140*a*. As described above, the opening 190 can have substantially the same size and/or shape as the center-mounted panel 140*a*. Accordingly, as shown by FIG. 12, the nested wall module 120*a* can have a substantially seamless interface between the first and the second face-mounted panels 131*c*, 131*d* and the center-mounted panel 140*a*.

A nesting frame assembly 180 can couple the center-mounted panel 140*a* within the hole 190 and to the face-mounted panels 131*c*, 131*d*. In particular, the each of the face-mounted panels 131*c*, 131*d* can attach to the nesting frame assembly 180. The center-mounted panel 140*a* can in turn couple to the nesting frame assembly 180, such that the center-mounted panel 140*a* is entirely supported by the face-mounted panels 131*c*, 131*d* via the nesting frame assembly 180.

More specifically, referring to FIG. 13, the nesting frame assembly 180 can include one or more nesting brackets 240*a*, 240*b*, 240*c*, 240*d* (sometimes referred hereinto as window extrusions). The nesting brackets 240*a-d* can comprise any suitable rigid material, such as aluminum, steel, zinc, plastic, etc. In one or more implementations, the manufacturer can extrude a molten material through an extrusion die to form the nesting brackets 240*a-d*. The assembler can connect and/or couple the nesting brackets 240*a-d* one to another to form the nesting frame assembly 180. In one or more implementations, the assembler can use one or more corner cinch assemblies 250 to connect and/or couple the nesting brackets 240*a-d* one to another. For example, the corner cinch assemblies 250 can fit into a cinch channel 260 in the nesting brackets 240*a-d*.

The nesting brackets 240*a-d* can then couple the first and the second face-mounted panels 131*c*, 131*d* and the center-mounted panel 140*a* together. In particular, each nesting bracket 240*a-d* can include a panel channel 220 sized and configured to hold an edge of the center-mounted panel 140*a*. In one or more implementations, the panel channel 220 can also accommodate a glass wipe 230, which can protect and secure the center-mounted panel 140 within the panel channel 220.

The nesting brackets 240*a-d* can further include one or more engagement protrusions 270, similar to the engagement protrusions 137 described above. One or more connectors 200 secured to the face-mounted panels 130 can in turn attach to the engagement protrusions 270 to couple the face-mounted panels 130 to the nesting brackets 240*a-d*. The connectors 200 can couple the face-mounted panels 130 to the nesting frame assembly 180 (e.g., the connectors 200 can snap into or about an engagement protrusions 137.

In at least one implementation, the nesting brackets 240*a-d* can have mitered ends 261, which can form a desired angle between the nesting brackets 240*a-d* when the corner cinch assembly 250 couples one nesting bracket 240*a-d* to another nesting bracket 240*a-d*. For instance, the nesting brackets 240*a* and 240*b* can have 45° mitered ends 261. Accordingly, when the corner cinch assembly 250 couples the nesting bracket 240*a* to the nesting bracket 240*b*, the coupled nesting brackets 240*a*, 240*b* form a 90° angle therebetween.

The nesting brackets 240*a-d* also can have mitered ends 261 that can result in non-transversely aligned coupled nesting brackets 240*a-d*. For instance, the nesting brackets 240*a* and 240*b* can have mitered ends 261 that have 35° angles. Accordingly, when the corner cinch assembly 250 couples the nesting brackets 240*a* and 240*b* the coupled nesting brackets 240*a*, 240*b* can form a 70° angle therebetween. Hence, the manufacturer or assembler can couple the nesting brackets 240*a-d* one to another at substantially any desired angle, for example, by choosing a desired angle for the mitered ends 261 of the nesting brackets 240*a-d*. Furthermore, as described above, the nesting frame assembly 180 can include multiple nesting brackets 240*a-d*. For instance, the nesting frame assembly 180 can include four nesting brackets 240*a*, 240*b*, 240*c*, 240*d* as shown in FIG. 13. Where the installer desires to form the nesting frame assembly 180 that has a substantially rectangular shape, the installer can couple together four nesting brackets 240*a-d*, which have mitered ends 261 at 45° angles. The installer also can form the nesting frame assembly 180 that has other shapes using a similar technique, by choosing a desired number of the nesting brackets 240a-d and by choosing the appropriate angles for the mitered ends 261. For example, the installer can form a triangular nesting frame assembly 180 by coupling three nesting brackets that have mitered ends 261 at 30° angles.

Thus, the nesting frame assembly 180 can have various shapes, which may include nonlinear segments. For example, one or more nesting brackets may have nonlinear configuration (e.g., arcuate, bent, irregular shaped, etc). Accordingly, the nesting frame assembly 180 can have a circular, elliptical, irregular, as well as any other desired shape. Similarly, the nested face-mounted panels 130 and/or center-mounted panels 140a also can have substantially any desired shape, which may correspond with the shape of the nesting frame assembly 180.

Figure 14:
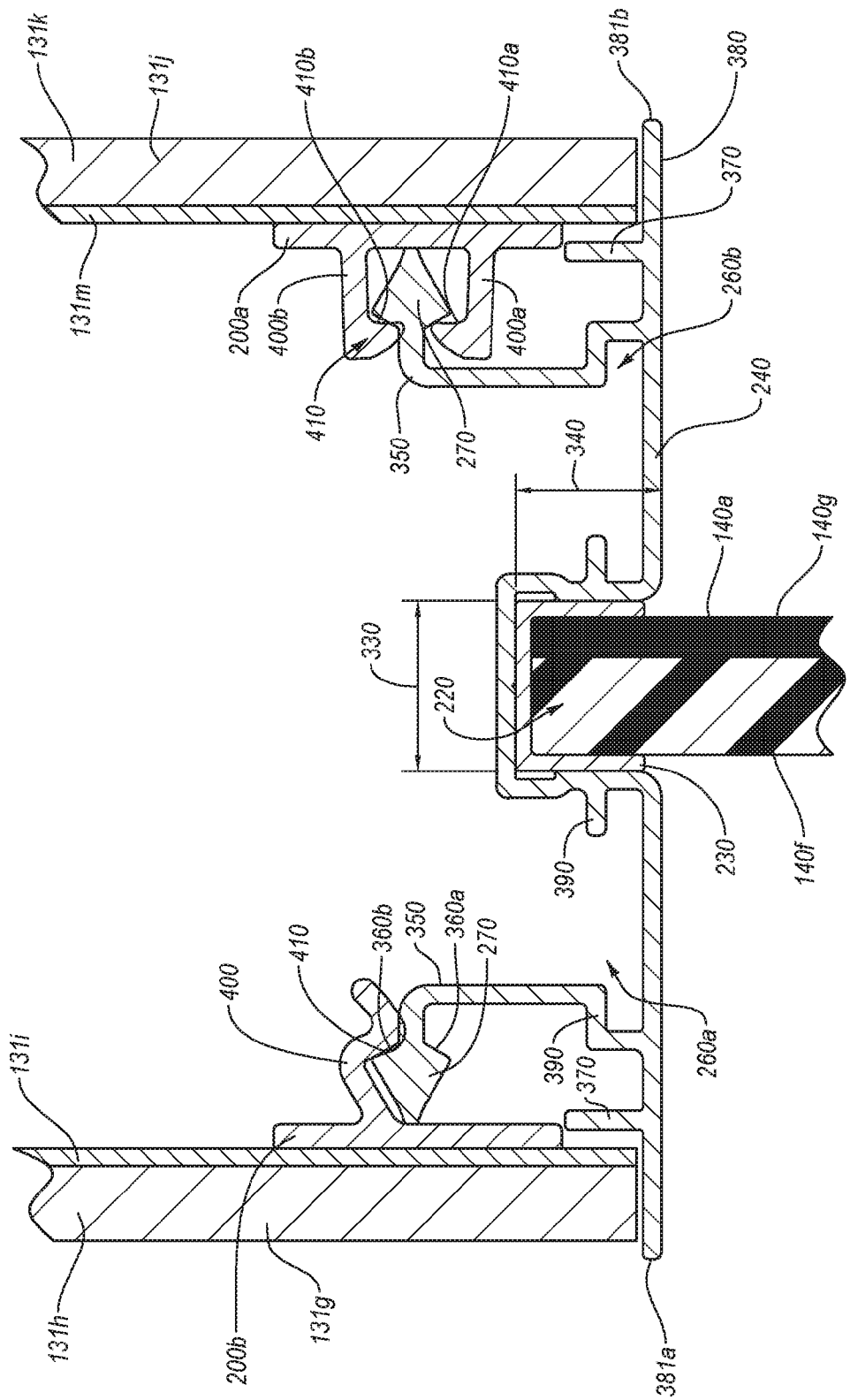

Referring now to FIG. 14, the nesting brackets 240a-d and how they attach to the face-mounted panels 130 and the center-mounted panel 140a is described in greater detail. For example, as illustrated in FIG. 14, the nesting brackets 240 can include a panel channel 220 for receiving and holding an edge of a center-mounted panel 140a. In particular, the profile of the nesting bracket 240 can include an undercut 320 that that defines the panel channel 220.

The undercut 320 can comprise a generally u-shaped channel. The undercut 320 can extend away from a front surface or face 380 of the nesting bracket 240. In one or more implementations, the panel channel 220 is in the middle of the nesting bracket 240 between opposing ends 381a, 381b as shown by FIG. 14. Alternatively, the panel channel 220 is located at other positions within the depth of the nested wall module. One will appreciate that the position of the panel channel 220 dictates the position of the center-mounted panel 140a (including glass panel 140f and substrate 140g) relative to the face-mounted panels 131g (including glass panel 131h and substrate 131i) and 131j (including glass panel 131k and substrate 131m). Thus, in one or more implementations the panel channel 220 is located proximate an end 381a, 381b of the nesting bracket 240. In such implementations, the center-mounted panel 140a will be positioned proximate one of the face-mounted panels 131g, 131j rather than being positioned between them.

Furthermore, while the Figures illustrate that the nesting brackets 240 have a single panel channel 220, the present invention is not so limited. In alternative implementation, the nesting bracket 240 can include two, three, or more panel channels 220, and thus, hold more than one center-mounted panel 140a. For example, in one or more implementations the nesting bracket 240 includes two panel channels 200, which each hold a center-mounted panel 140a. A gap between the center-mounted panels 140a can act as insulation or a sound barrier. In one or more implementations, the panel channel 220 can have a width 330, which can accommodate the center-mounted panels 140a and/or the glass wipe 230. For example, the panel channel 220 can have the width 330 the same as an outer width of the glass wipe 230. Accordingly, the panel channel 220 can secure the glass wipe 230 and the center-mounted panel 140a to the nesting bracket 240. Alternatively, the panel channel 220 can have the width 330 that may be larger or smaller than the width of the glass wipe 230. For instance, the panel channel 220 can have the width 330 that is slightly smaller than the width of the glass wipe 230. Thus, the glass wipe 230 and/or the center-mounted panel 140a can have an interference fit within the panel channel 220. For example, when the panel channel 220 has a width 330 that is slightly smaller than the width of the glass wipe 230, the glass wipe 320 can apply pressure and squeeze about the center-mounted panel 140a to hold the center-mounted panel 140a within the panel channel 220.

The panel channel 220 also can have a depth 340, which can accommodate the glass wipe 230 and a portion of the center-mounted panel 140a therein. In one or more implementations the depth 340 of the panel channel can be between about ⅛ an inch and about 1 inch. In alternative implementations, the depth 340 of the panel channel 220 can be greater or smaller.

The glass wipe 230 can comprise an elastomeric material, such as natural or synthetic rubber or another resilient material. Accordingly, the glass wipe 230 can provide shock absorption to the center-mounted panel 140a, which may reduce accidental breakage of the center-mounted panel 140a in response to impact. The glass wipe 230 also can deform about the center-mounted panel 140a, which may improve coupling of the center-mounted panel 140a to the nesting bracket 240.

Additionally or alternatively, the glass wipe 230 can form a seal between the center-mounted panel 140a and the nesting frame assembly 180, which may provide improved sound dampening as well as thermal insulation properties of the wall modules. Such improved sound dampening properties for the nested wall modules 120 may result in reduced amount of noise that may be heard by occupants of the individual space created by the modular wall system 100. Similarly, improved thermal insulation of the nested center-mounted panel 140a can allow the occupants of one or more individual spaces defined by the modular wall system 100 to better control temperature within such individual spaces.

As mentioned previously, the nesting brackets 240 also can incorporate one or more engagement protrusions 270. In particular, as illustrated by FIG. 14, an L-shaped arm 350 can extend away from the face 380 of the nesting bracket 240. Each arm 350 can hold an engagement protrusion 270 at the end thereof. The L-shaped arms 350 can point each of the engagement protrusions 270 away from the panel channel 220, and away from each other. As shown by FIG. 9, the engagement protrusions 270 may not extend all the way to the ends 381a, 381b of the nesting bracket 240. This can allow the ends 381a, 381b of the nesting bracket 240 to cover the ends of the face-mounted panels 131g, 131j.

As shown by FIG. 14, the nesting bracket 240, and particularly the engagement protrusions 270 and panel channel 220 can hold the panels 140a, 131g, 131j, such that the center-mounted panel 140a extends in a first direction from the nesting bracket 240, and the face-mounted panels 131g, 131j extend from the nesting bracket 240 in a second opposing direction. One will appreciate that this can allow for the nesting of panels.

In one or more implementations, the engagement protrusion 270 can comprise a barb or an arrow-shaped head. The panels 131g, 131j can in turn include clips or connectors 200a, 200b including one or more flexible arms 400, 400a, 400b that clip or snap about the head of engagement protrusion 270 to secure the panels 131g, 131j to the nesting bracket 240. In particular, the flexible arms or prongs 400, 400a, 400b of the connectors 200a, 200b can surround at least a portion of the head of the engagement protrusion 270.

The ability to clip the panels 131g, 131j to the nesting bracket 240 can allow a user to selectively remove, move, or reconfigure the position a panel within a given modular wall system. In alternative implementations, the panels 131g, 131*j* may not include connectors 200*a*, 200*b*. In such implementations, a user can fasten the panels 131*g*, 131*j* directly to the nesting bracket 240 via screws or other fasteners. One will appreciate that such implementations can allow a user to retro fit a given wall module with a nested wall module.

As shown by FIG. 14, engagement protrusions or barbs 270 can include one or more undercutting edges 360*a*, 360*b*. Accordingly, the undercutting edges 360*a*, 360*b* of the engagement protrusions or barbs 270 can couple the corresponding portions of the connectors 200*a*, 200*b*. In particular, connectors 200*a*, 200*b* can have one or more flexible arms or prongs 400, 400*a*, 400*b* that may incorporate one or more undercutting lips 410 (e.g., prongs can incorporate undercutting lips 410*a*, 410*b*, respectively). Thus, the undercutting edges 360*a*, 360*b* of the engagement protrusions or barbs 270 can mate with one or more undercutting lips 410 of the flexible arms or prongs 400, 400*a*, 400*b*. For instance, the flexible arms or prongs 400, 400*a*, 400*b* can flex outward to allow the undercutting lips 410 to move around the undercutting edges 360*a*, 360*b* of the flexible arms or prongs 400, 400*a*, 400*b* so the undercutting edges 360*a*, 360*b* can snap into the connectors 200*a*, 200*b*.

Mechanical or other fasteners can couple the connectors 200*a*, 200*b* to the face-mounted panels 131*g*, 131*j* (e.g., screws, bolts, glue, Velcro, welding, such as ultrasonic welding, etc.). In preferred embodiments, as illustrated, the connectors 200*a*, 200*b* are connected to the respective substrates 131*i*, 131*m* of the panels. Additionally, or alternatively, a dowel can extend from the back surface of the connector 200*a*, 200*b* into a corresponding hole within the face-mounted panels 131*g*, 131*j*. Such dowels can provide location and orientation for the connectors 200*a*, 200*b* on the face-mounted panels 131*g*, 131*j* and vice versa. Therefore, by locating the connectors 200*a*, 200*b* at predetermined locations on the face-mounted panels 131*g*, 131*j*, the assembler can ensure that the connectors 200*a*, 200*b* properly align with engagement protrusions or barbs 270 of the nesting bracket 240.

The nesting bracket 240 also can include one or more standoffs 370. The standoffs 370 can protrude outward from the face 380 of the nesting brackets 240. In one or more implementations, the standoffs 370 can locate the nesting brackets 240, and consequently the nesting frame assembly 180, with respect to the connectors 200*a*, 200*b*. Additionally or alternatively, the standoffs 370 can rest on at least a portion of the connectors 200*a*, 200*b*, thereby providing additional support to the nesting brackets 240. For example, by supporting the nesting brackets 240 oriented horizontally.

Additionally, the nesting brackets 240 can include one or more cinch channels 260 (e.g., such as cinch channels 260*a*, 260*b* shown in FIG. 9). The cinch channels 260*a*, 260*b* can accommodate one or more fastening elements that can couple to or more nesting brackets 240 together. For example, the cinch channels 260*a*, 260*b* can accommodate and secure the corner cinch assemblies 250 therein. More specifically, the cinch channels 260 can have a T-slot shape defined by lips 390. The lips 390 can secure one or more portions of the corner cinch assemblies 250 within the cinch channels 260*a*, 260*b*.

In particular, the cinch channel 260*a*, 260*b* can have a T-slot shape, such that the installer can secure the corner cinch assemblies 250 within the cinch channel 260*a*, 260*b*. Additionally or alternatively, the installer can couple one nesting bracket 240 to another nesting bracket 240 using fasteners, straps, and/or other mechanical connections. Moreover, the installer also can weld the nesting brackets 240 together, thereby forming a desired coupling therebetween.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

As used herein, the terms "substantially," "about," and the like, refer to an amount or condition that is within 99%, or within 95%, or within 90%, or within 80%, of a stated amount or condition. In addition, where values or conditions are stated without being associated with the terms "substantially," "about," or the like, the values are to be interpreted as being "substantially" or "about" the stated value or condition.

We claim:

1. A reinforced panel configured for use with a reconfigurable wall, wherein the reinforced panel is touch-responsive, the reinforced panel comprising:
    a first layer formed from a material;
    a substrate coupled to the first layer, the substrate being formed from a second material;
    an intermediate layer disposed between the first layer and the substrate, the intermediate layer being formed at least in part from a material that is elastically deformable;
    wherein the intermediate layer has sufficient elastic deformability so as to enable the reinforced panel to tolerate differences in thermal expansion between the substrate and the first layer without resulting in cracking of the first layer;
    wherein the intermediate layer comprises at least one of: (i) at least one flexible adhesive layer, (ii) at least one flexible ceramic, and (iii) a flexible porcelain layer;
    one or more connectors coupled to the substrate on a side of the substrate opposite the first layer, the one or more connectors configured to allow the panel to be integrated with a reconfigurable wall;
    a conductive material at least partially covering a surface of the substrate, the conductive material being disposed between the first layer and a delineating material disposed on the substrate; and a controller in electrical communication with the conductive material; wherein:
    the conductive material forms at least one touch-responsive section; and the delineating material defines a boundary of the at least one touch-responsive section.

2. The reinforced panel of claim 1, wherein the intermediate layer further comprises at least one polymer layer.

3. The reinforced panel of claim 1, wherein:
    the intermediate layer comprises a porcelain material; and
    wherein the substrate is formed at least in part from a metal.

4. The reinforced panel of claim 1, wherein the first layer, the intermediate layer, and the substrate are joined by adhesion.

5. The reinforced panel of claim 1, wherein:
    the reinforced panel is configured to withstand different levels of thermal expansion of the first layer and the substrate without resulting in breakage of the first layer or the substrate;
    the first layer and the substrate have coefficients of thermal expansion that are substantially similar, or that are about 75%; and
    the second material is a high pressure laminate.

6. The reinforced panel of claim 1, wherein the first layer comprises a painted surface on a side of the first layer facing the substrate.

7. The reinforced panel of claim 1, wherein the one or more connectors are joined to the substrate by adhesion.

8. The reinforced panel of claim 1, wherein the one or more connectors are joined to the substrate by mechanical fastening.

9. The reinforced panel of claim 1, further comprising:
a film at least partially disposed between the first layer and the substrate;
wherein the substrate has a thickness of about 0.5 inches.

10. The reinforced panel of claim 1, wherein the substrate and the first layer are substantially the same shape.

11. The reinforced panel as recited in claim 1, wherein the at least one touch-responsive section comprises a plurality of separate touch-responsive sections.

12. The reinforced panel as recited in claim 1, wherein: the at least one touch-responsive section comprises a plurality of separate touch-responsive sections; and the delineating material provides the boundaries of each of the separate touch-responsive sections; wherein the delineating material comprises a reusable tape.

13. The reinforced panel as recited in claim 1, wherein the material of the first layer comprises at least one of a glass, a thermofoil, a resin, or a thermoplastic material.

14. The reinforced panel of claim 1, wherein the conductive material includes a graphite dry lubricant.

15. The reinforced panel of claim 1, further comprising: a connector joining the controller to the conductive material; wherein the connector comprises a copper tape, or a conductive ink.

16. A touch-responsive reinforced panel configured for use with a reconfigurable wall, the panel comprising:
a first layer formed from a first material, the first material comprising a thermofoil material;
a substrate coupled to the first layer, the substrate being formed from a second material;
a conductive material at least partially covering a surface of the substrate, the conductive material being disposed between the first layer and the substrate and forming a touch-responsive section; and
a controller in electrical communication with the conductive material;
wherein:
the conductive material is disposed on the substrate so as to form a plurality of separate touch-responsive sections; and a tape disposed on the substrate defines boundaries of the separate touch-responsive sections.

17. The touch-responsive reinforced panel of claim 16, wherein the conductive material includes a graphite dry lubricant.

18. The touch-responsive reinforced panel of claim 16, further comprising:
a connector joining the controller to the conductive material;
wherein the connector is formed from a copper tape.

19. The panel of claim 16, further comprising:
a connector joining the controller to the conductive material;
wherein the connector is formed of conductive ink.

20. The panel of claim 16, wherein the controller is configured to control one or more devices in response to a touch signal received at the touch-responsive section.

21. The panel of claim 16, further comprising:
an intermediate layer disposed between the first layer and the substrate, the intermediate layer being formed of an elastically deformable material that allows for different levels of thermal expansion between the substrate and the first layer without resulting in cracking of the first layer.

22. The touch-responsive reinforced panel as recited in claim 21, wherein the intermediate layer comprises at least one of: (i) at least one flexible adhesive layer, (ii) at least one flexible ceramic layer, (iii) a flexible porcelain layer; and (iii) a polymer layer.

23. The touch-responsive reinforced panel as recited in claim 22, wherein:
the intermediate layer comprises a porcelain material; and
wherein the substrate is formed at least in part from a metal.

24. The touch-responsive reinforced panel as recited in claim 21, wherein the first layer, the intermediate layer, and the substrate are joined by adhesion.

25. The touch-responsive reinforced panel as recited in 16, wherein the material of the first layer further comprises one or more of a glass, a resin, or a thermoplastic material.

26. The touch-responsive reinforced panel as recited in claim 16, wherein:
the first layer and the substrate have coefficients of thermal expansion that are substantially similar, or that are about 75%; and
the second material comprises a high pressure laminate.

27. The touch-responsive reinforced panel as recited in claim 16, wherein the first layer comprises a painted surface on a side of the first layer facing the substrate.

28. The touch-responsive reinforced panel as recited in claim 16, further comprising:
a film at least partially disposed between the first layer and the substrate;
wherein the substrate has a thickness of about 0.5 inches.

29. The touch-responsive reinforced panel as recited in claim 16, wherein the substrate and the first layer are substantially the same shape.

30. The touch-responsive reinforced panel as recited in claim 16, further comprising one or more connectors coupled to the substrate on a side of the substrate opposite the first layer, the one or more connectors configured to allow the touch-responsive reinforced panel to be integrated with a reconfigurable wall.

31. The touch-responsive reinforced panel as recited in claim 30, wherein the one or more connectors are joined to the substrate by adhesion.

32. The touch-responsive reinforced panel as recited in claim 30, wherein the one or more connectors are joined to the substrate by mechanical fastening.

* * * * *